United States Patent
Lee et al.

(10) Patent No.: US 12,456,415 B2
(45) Date of Patent: Oct. 28, 2025

(54) DISPLAY PANEL INCLUDING SENSING ELECTRODE AND ELECTRODE OF LIGHT EMITTING ELEMENT ELECTRICALLY SEPARATED BY AT LEAST ONE SEPARATOR AND DISPLAY DEVICE INCLUDING THE SAME

(71) Applicant: Samsung Display Co., Ltd., Yongin-Si (KR)

(72) Inventors: Jeongyoon Lee, Yongin-si (KR); Kyungho Kim, Yongin-si (KR); Ok-Kyung Park, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 0 days.

(21) Appl. No.: 18/396,716

(22) Filed: Dec. 27, 2023

(65) Prior Publication Data

US 2024/0221619 A1 Jul. 4, 2024

(30) Foreign Application Priority Data

Dec. 28, 2022 (KR) ........................ 10-2022-0186937

(51) Int. Cl.
G09G 3/32 (2016.01)

(52) U.S. Cl.
CPC ....... *G09G 3/32* (2013.01); *G09G 2320/0666* (2013.01)

(58) Field of Classification Search
CPC .......................... G09G 2320/0666; G09G 3/32
See application file for complete search history.

(56) References Cited

U.S. PATENT DOCUMENTS

| | | | |
|---|---|---|---|
| 8,648,337 B2 | 2/2014 | Hsieh | |
| 9,806,279 B2 | 10/2017 | Im et al. | |
| 10,108,290 B2 | 10/2018 | Hwang et al. | |
| 10,879,316 B2 | 12/2020 | Lee et al. | |
| 2021/0057502 A1* | 2/2021 | Kim | H01L 27/1251 |
| 2022/0004304 A1* | 1/2022 | Yang | G06F 3/0446 |
| 2022/0206621 A1* | 6/2022 | Lee | G06F 3/04164 |
| 2024/0029633 A1* | 1/2024 | Won | H10K 59/131 |
| 2024/0138203 A1* | 4/2024 | Kang | H10K 59/123 |
| 2024/0155898 A1* | 5/2024 | Kim | H10K 59/80521 |

FOREIGN PATENT DOCUMENTS

| | | |
|---|---|---|
| CN | 103280539 A | 9/2013 |
| KR | 10-2016-0006110 A | 1/2016 |
| KR | 10-1679977 B1 | 11/2016 |
| KR | 10-2020-0091059 A | 7/2020 |
| KR | 10-2022-0096761 A | 7/2022 |

* cited by examiner

*Primary Examiner* — Chun-Nan Lin
(74) *Attorney, Agent, or Firm* — Harness, Dickey & Pierce, P.L.C.

(57) ABSTRACT

A display panel includes a transistor, a light emitting element, a pixel defining layer, a separator, and a sensing electrode. The light emitting elements includes a first electrode, an intermediate layer disposed on the first electrode, and a second electrode disposed on the intermediate layer. The second electrode is electrically connected to the transistor. The pixel defining film is disposed on the first electrode and defines an emission opening above the first electrode. The separator is disposed on the pixel defining film. The sensing electrode is disposed on the separator. The sensing electrode and the second electrode are electrically separated by the separator.

35 Claims, 21 Drawing Sheets

DISPLAY PANEL INCLUDING SENSING ELECTRODE AND ELECTRODE OF LIGHT EMITTING ELEMENT ELECTRICALLY SEPARATED BY AT LEAST ONE SEPARATOR AND DISPLAY DEVICE INCLUDING THE SAME

CROSS-REFERENCE TO RELATED APPLICATIONS

This U.S. non-provisional patent application claims priority, under 35 U.S.C. § 119, of Korean Patent Application No. 10-2022-0186937 filed on Dec. 28, 2022, the entire content of which is hereby incorporated by reference.

BACKGROUND

The inventive concept relates to a display panel and a display device, and more particularly, to a display panel and display device with improved display quality.

Multimedia electronic devices such as televisions, mobile phones, tablets, computers, navigation devices, and game machines include display panels for displaying images.

The display panel includes a light emitting element and a pixel driver for driving the light emitting element. In order to improve the reliability of display panels, research is being conducted on the connection of light emitting elements and circuits.

SUMMARY

The inventive concept provides a display panel and a display device in which afterimage defects are reduced, lifespan is lengthened, and electrical reliability is improved.

An embodiment of the inventive concept provides a display panel including: a transistor; a light emitting element including a first electrode, an intermediate layer disposed on the first electrode, and a second electrode disposed on the intermediate layer, wherein the second electrode is electrically connected to the transistor; a pixel defining film disposed on the first electrode and defining an emission opening above the first electrode; a separator disposed on the pixel defining film; and a sensing electrode disposed on the separator, wherein the sensing electrode and the second electrode are electrically separated by the separator.

In an embodiment, the sensing electrode may include a plurality of first sensing electrodes and a plurality of second sensing electrodes that are insulated from one another.

In an embodiment, the display panel may further include a connection wiring electrically connecting the transistor and the second electrode, wherein the connection wiring may include a first connection part connected to the second electrode, a second connection part connected to the transistor, and an extension part extending from the first connection part and electrically connecting the first connection part and the second connection part, wherein a light emitting unit may be defined by the emission opening, wherein the connection wiring and the light emitting unit may be provided in plurality.

In an embodiment, each of the first sensing electrodes may include a plurality of first sensing patterns arranged in a first direction, wherein each of the second sensing electrodes may include a plurality of second sensing patterns arranged in a second direction crossing the first direction.

In an embodiment, each of the first sensing electrodes may further include a first bridge pattern electrically connecting two adjacent first sensing patterns of the first sensing patterns.

In an embodiment, the first bridge pattern may be disposed on a different layer from the first sensing patterns and overlaps a part of the second sensing patterns on a plane.

In an embodiment, the display panel may further include a detection insulating layer covering the second sensing patterns, wherein the first bridge pattern may be disposed on the detection insulating layer.

In an embodiment, the first bridge pattern may be spaced apart from the first connection part in the second direction.

In an embodiment, the first bridge pattern may include a first bridge end portion and a second bridge end portion which are connected to the two first sensing patterns adjacent to the first bridge pattern, and a bridge bending portion connecting the first bridge end portion to the second bridge end portion, wherein at least one light emitting unit may be disposed between the first bridge end portion and the second bridge end portion.

In an embodiment, each of the second sensing electrodes may further include a second bridge pattern electrically connecting two adjacent second sensing patterns among the second sensing patterns.

In an embodiment, the second bridge pattern may be disposed on a different layer from the second sensing patterns and overlaps a part of the first sensing patterns.

In an embodiment, the second bridge pattern may be spaced apart from the first connection part in the first direction.

In an embodiment, each of the first bridge pattern and the second bridge pattern may be provided in plurality.

In an embodiment, each of the second sensing electrodes may further include a connection pattern which is disposed between two adjacent second sensing patterns and connects the two adjacent second sensing patterns.

In an embodiment, the connection pattern may be integrally formed with the two adjacent second sensing patterns in the second direction.

In an embodiment, the connection pattern may include first and second connection patterns spaced apart from each other in the first direction.

In an embodiment, boundary portions may be defined on the separator by insulating the first sensing electrode and the second sensing electrode from each other, wherein some of the boundary portions may be disposed between adjacent first connection parts.

In an embodiment, each of the first sensing patterns may include a first mesh line, wand each of the second sensing patterns may include a second mesh line.

In an embodiment, a plurality of first mesh holes may be defined in the first sensing patterns by each of the first mesh line, and a plurality of second mesh holes may be defined in the second sensing patterns by the second mesh line, wherein each of the mesh holes may correspond to the light emitting unit.

In an embodiment, each of the first mesh line and the second mesh line may overlap the separator.

In an embodiment, a width of each of the first mesh line and the second mesh line may be equal to or smaller than a width of the separator.

In an embodiment, the first sensing electrode and the second sensing electrode may be disposed on the same layer.

In an embodiment, each of the first sensing electrode and the second sensing electrode may be non-overlapping with the second electrode in plan view.

In an embodiment, the separator may include a first separator and a second separator spaced apart from the first separator, wherein the first sensing electrode may be disposed on the first separator, wherein the second sensing electrode may be disposed on the second separator.

In an embodiment, the display panel may further include: a first encapsulation layer disposed on the second electrode and the sensing electrode; a color encapsulation layer disposed on the first encapsulation layer; and a second encapsulation layer disposed on the color encapsulation layer.

In an embodiment, the light emitting element may include a first light emitting element, a second light emitting element, and a third light emitting element which emitting different color lights, wherein the color encapsulation layer may include: a first color encapsulation layer overlapping the first light emitting element; a second color encapsulation layer overlapping the second light emitting element; and a third color encapsulation layer overlapping the third light emitting element.

In an embodiment, the display panel may further include an overcoating layer disposed on the second encapsulation layer.

In an embodiment of the inventive concept, a display device includes: a display panel displaying an image; and a light control layer disposed on the display panel, wherein the display panel includes: a transistor; a light emitting element including a first electrode, an intermediate layer disposed on the first electrode, and a second electrode disposed on the intermediate layer, wherein the second electrode is electrically connected to the transistor; a pixel defining film disposed on the first electrode and defining an emission opening above the first electrode; a separator disposed on the pixel defining film; and a sensing electrode disposed on the separator, wherein the sensing electrode may overlap the separator and may not overlap the second electrode.

In an embodiment, the sensing electrode may include a plurality of first sensing electrodes and a plurality of second sensing electrodes that are electrically insulated from one another.

In an embodiment, a width of each of the first and second sensing electrodes may be equal to or smaller than a width of the separator.

In an embodiment, the display panel may further include a connection wiring electrically connecting the transistor and the second electrode, wherein the connection wiring may include a first connection part connected to the second electrode, a second connection part connected to the transistor, and an extension part extending from the first connection part and electrically connecting the first connection part and the second connection part, wherein a light emitting unit may be defined by the emission opening, wherein the connection wiring and the light emitting unit may be provided in plurality.

In an embodiment, each of the first sensing electrodes may include a plurality of first sensing patterns arranged in a first direction and a first bridge pattern electrically connecting two adjacent first sensing patterns of the first sensing patterns, wherein each of the second sensing electrodes may include a plurality of second sensing patterns arranged in a second direction crossing the first direction and a second bridge pattern electrically connecting two adjacent second sensing patterns of the second sensing patterns.

In an embodiment, the first bridge pattern may be disposed on a different layer from the first sensing patterns and overlaps a part of the second sensing patterns, wherein the second bridge pattern may be disposed on a different layer from the second sensing patterns and overlaps a part of the first sensing patterns.

In an embodiment, the first bridge pattern may be spaced apart from the first connection part in the second direction, and the second bridge pattern may be spaced apart from the first connection part in the first direction.

In an embodiment, the light control layer may include at least one of a dye and a pigment.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
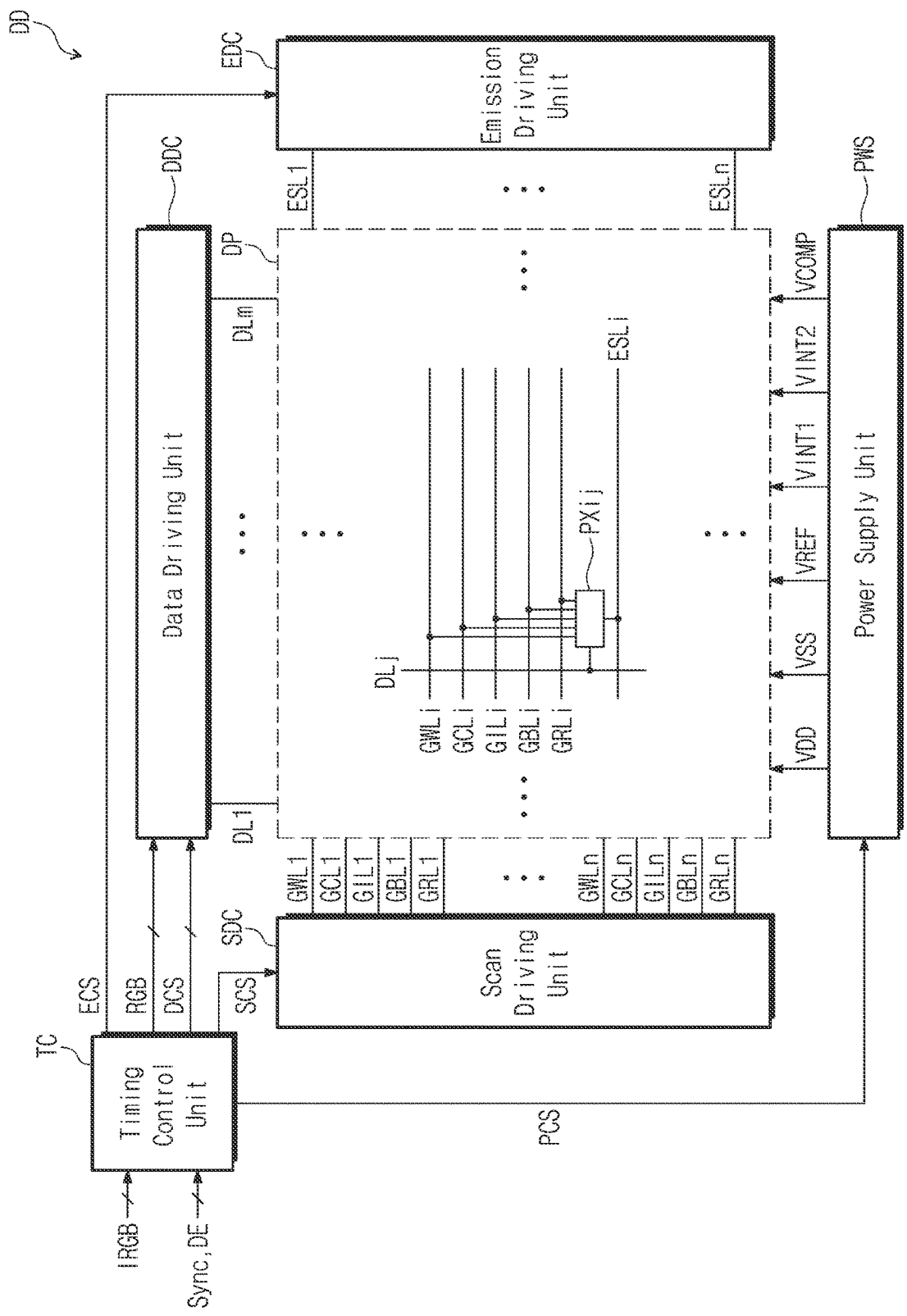
FIG. 1 is a block diagram of a display device according to an embodiment of the inventive concept.

Since the inventive concept may have various changes and may have various forms, specific embodiments are illustrated in the drawings and described in detail in the text. However, this is not intended to limit the inventive concept to specific embodiments, and should be understood to include all modifications, equivalents and substitutes included in the spirit and scope of the inventive concept.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing. As used herein, two elements "overlapping" is intended to mean that one of the elements partially or entirely covers the other element in plan view.

Unless otherwise defined, all terms (including technical and scientific terms) used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

FIG. 1 is a block diagram of a display device DD according to an embodiment of the inventive concept. Referring to FIG. 1, the display device DD may include a display panel DP, panel driving units SDC, EDC, and DDC, a power supply unit PWS, and a timing control unit TC. In this embodiment, the display panel DP is described as a light emitting display panel. The light emitting display panel may include an organic light emitting display panel, an inorganic light emitting display panel, or a quantum dot light emitting display panel. In embodiments to be described later, an organic light emitting display panel will be described in detail as an example.

The panel driving unit may include a scan driving unit SDC, an emission driving unit EDC, and a data driving unit DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include a plurality of pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm (m and n are integers greater than 1).

For example, the pixels PXij (where i and j are integers greater than 1) located on the i-th horizontal line (or the i-th pixel row) and the j-th vertical line (or the j-th pixel column) may be connected to the i-th first scan line (or write scan line GWLi), the i-th second scan line (or compensation scan line GCLi), the i-th third scan line (or first initialization scan line GILi), the i-th 4th scan line (or second initialization scan line GBLi), the i-th 5th scan line (or reset scan line GRLi), the j-th data line DLj, and the i-th emission line ESLi.

The pixel PXij may include a plurality of light emitting elements, a plurality of transistors, and a plurality of capacitors. The pixel PXij may receive a first power voltage VDD, a second power supply voltage VSS, a third power voltage (or reference voltage VREF), a fourth power supply voltage (or first initialization voltage VINT1), a fifth power supply voltage (or second initialization voltage VINT2), and a sixth power supply voltage (or compensation voltage VCOMP) through a power supply unit PWS.

The voltage values of the first power supply voltage VDD and the second power supply voltage VSS are set so that current flows through the light emitting element to emit light. For example, the first power supply voltage VDD may be set to a higher voltage than the second power supply voltage VSS.

The third power supply voltage VREF may be a voltage for initializing a gate of a driving transistor included in the pixel PXij. The third power supply voltage VREF may be used to implement a predetermined grayscale using a voltage difference with the data signal. To this end, the third power supply voltage VREF may be set to a predetermined voltage within a voltage range of the data signal.

The fourth power supply voltage VINT1 may be a voltage for initializing a capacitor included in the pixel PXij. The fourth power supply voltage VINT1 may be set to a voltage lower than the third power supply voltage VREF. For example, the fourth power supply voltage VINT1 may be set to a voltage lower than a difference between the third power supply voltage VREF and the threshold voltage of the driving transistor. However, the inventive concept is not limited thereto.

The fifth power supply voltage VINT2 may be a voltage for initializing a cathode of a light emitting element included in the pixel PXij. The fifth power supply voltage VINT2 may be set to a voltage lower than the first power supply voltage VDD or the fourth power supply voltage VINT1, or may be set to a voltage similar to or equal to the third power supply voltage VREF, but the embodiment of the inventive concept is not limited thereto, and the fifth power supply voltage VINT2 may be set to a voltage similar to or equal to the first power supply voltage VDD.

The sixth power supply voltage VCOMP may supply a predetermined current to the driving transistor when compensating for the threshold voltage of the driving transistor.

Meanwhile, in FIG. 1, it is shown that all of the first to sixth power supply voltages VDD, VSS, VREF, VINT1, VINT2, and VCOMP are supplied from the power supply unit PWS, but the inventive concept is not limited thereto. For example, both the first power supply voltage VDD and the second power supply voltage VSS are supplied regardless of the structure of the pixel PXij, and at least one of the third power supply voltage VREF, the fourth power supply voltage VINT1, the fifth power supply voltage VINT2, and the sixth power supply voltage VCOMP may not be supplied corresponding to the structure of the pixel PXij.

In an embodiment of the inventive concept, signal lines connected to the pixel PXij may be set in various ways corresponding to the circuit structure of the pixel PXij.

The scan driving unit SDC may receive the first control signal SCS from the timing control unit TC, and supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The scan signal may be set to a voltage at which transistors receiving the scan signal may be turned on. For example, a scan signal supplied to a P-type transistor may be set to a logic low level, and a scan signal supplied to an N-type transistor may be set to a logic high level. Hereinafter, "supplied with a scan signal" may be understood to mean that the scan line is supplied with a logic level that turns on a transistor controlled by the scan signal.

In FIG. 1, for convenience of description, the scan driving unit SDC is shown as a single component, but the inventive concept is not limited thereto. According to the embodiment, in order to supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn, a plurality of scan driving units may be included.

The emission driving unit EDC may supply an emission signal to the emission lines ESL1 to ESLn based on the second control signal ECS. For example, emission signals may be sequentially supplied to the emission lines ESL1 to ESLn. Transistors connected to the emission lines ESL1 to ESLn of the inventive concept may be configured as N-type transistors. In this case, emission signals supplied to the emission lines ESL1 to ESLn may be set to a gate-off voltage. Transistors receiving the emission signal may be turned off when the emission signal is supplied, and may be turned on in other cases.

The second control signal ECS includes a light emission start signal and clock signals, and the emission driving unit EDC may be implemented as a shift register that sequentially generates and outputs a pulse-type emission signal by sequentially shifting a pulse-type emission start signal using clock signals.

The data driving unit DDC may receive the third control signal DCS and image data RGB from the timing control unit TC. A data driving unit DDC may convert digital image data RGB into an analog data signal (i.e., a data signal). The data driving unit DDC may supply data signals to the data lines DL1 to DLm in response to the third control signal DCS.

The third control signal DCS may include a data enable signal, a horizontal start signal, and a data clock signal instructing output of a valid data signal. For example, the data driving unit DDC may include a shift register that generates a sampling signal by shifting the horizontal start signal in synchronization with the data clock signal, a latch that latches image data RGB in response to a sampling signal, a digital-to-analog converter (or decoder) that converts latched image data (e.g., digital data) into analog data signals, and buffers (or amplifiers) that output data signals to the data lines DL1 to DLm.

The power supply unit PWS may supply the first power supply voltage VDD, the second power supply voltage VSS, and the third power supply voltage VREF for driving the pixel PXij to the display panel DP. In addition, the power supply unit PWS may supply at least one of the fourth power supply voltage VINT1, the fifth power supply voltage VINT2, and the sixth power supply voltage VCOMP to the display panel DP.

Figure 2A:
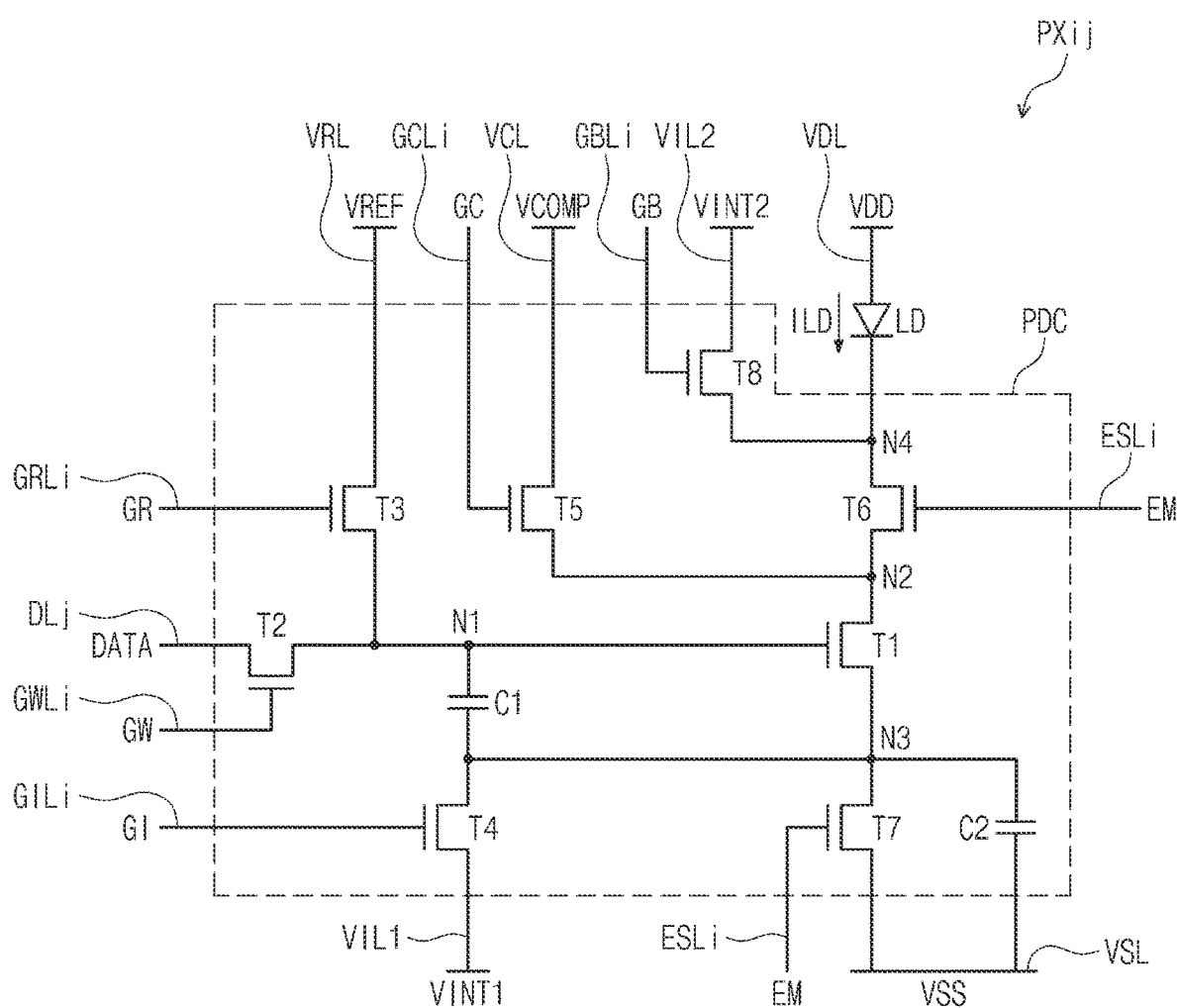
FIG. 2A is an equivalent circuit diagram of a pixel according to an embodiment.

As an example, the power supply unit PWS may supply each of the first power supply voltage VDD, the second power supply voltage VSS, the third power supply voltage VREF, the fourth power supply voltage VINT1, the fifth power supply voltage VINT2, and the sixth power supply voltage VCOMP to the display panel DP through the first power supply line VDL (see FIG. 2A), the second power supply line VSL (see FIG. 2A), the third power supply line (or reference voltage line VRL, see FIG. 2A), the fourth power supply line (or first initialization voltage line VIL1, see FIG. 2A), the fifth power supply line (or second initialization voltage line VIL2, see FIG. 2A), and the sixth power supply line (or compensation voltage line VCL, see FIG. 2A).

The power supply unit PWS may be implemented as a power management integrated circuit, but the embodiment of the inventive concept is not limited thereto.

The timing control unit TC may generate a first control signal SCS, a second control signal ECS, a third control signal DCS, and a fourth control signal PCS based on the input image data IRGB, the synchronization signal Sync (e.g., vertical synchronization signal, horizontal synchronization signal, etc.), the data enable signal DE, a clock signal, and the like. The first control signal SCS may be supplied to the scan driving unit SDC, the second control signal ECS may be supplied to the emission driving unit EDC, the third control signal DCS may be supplied to the data driving unit DDC, and the fourth control signal PCS may be supplied to the power supply unit PWS. The timing control unit TC rearranges the input image data IRGB to correspond to the arrangement of the pixels PXij in the display panel DP and generates image data RGB (or frame data).

Meanwhile, the scan driving unit SDC, the emission driving unit EDC, the data driving unit DDC, the power supply unit PWS, and/or the timing control unit TC may be formed directly on the display panel DP, or may be provided in the form of a separate driving chip and connected to the display panel DP. In addition, at least two of the scan driving unit SDC, the emission driving unit EDC, the data driving unit DDC, the power supply unit PWS, and the timing control unit TC may be provided as one driving chip. For example, a data driving unit DDC and a timing control unit TC may be provided as one driving chip.

In the above, the display device DD according to an embodiment has been described with reference to FIG. 1, but the display device of the inventive concept is not limited thereto. Additional signal lines may be added or omitted according to the configuration of pixels. Also, a connection relationship between one pixel and signal lines may be changed. When one of the signal lines is omitted, another signal line may replace the omitted signal line.

Figure 2B:
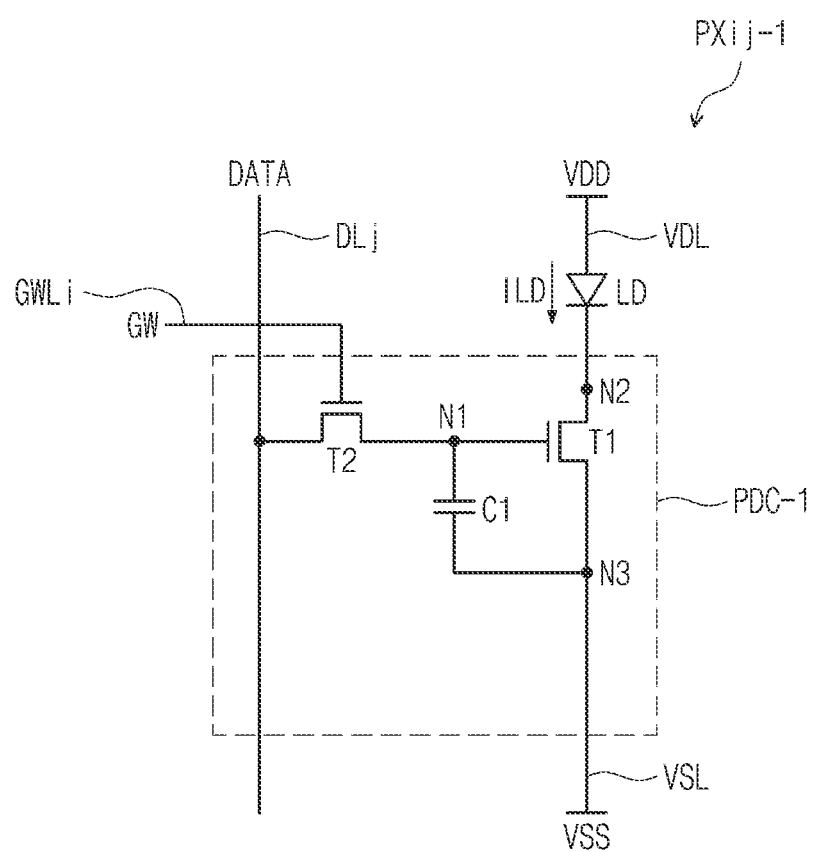
FIG. 2B is an equivalent circuit diagram of a pixel according to an embodiment.

FIGS. 2A and 2B are equivalent circuit diagrams of pixels according to an embodiment. FIGS. 2A and 2B illustrate equivalent circuit diagrams of pixels PXij and PXij-1 connected to the i-th first scan line GWLi (hereinafter referred to as a first scan line) and connected to the j-th data line DLj (hereinafter referred to as a data line).

As shown in FIG. 2A, the pixel PXij includes a light emitting element LD and a pixel driving unit PDC. The light emitting element LD is connected to a first power supply line VDL and a pixel driving unit PDC.

The pixel driving unit PDC may be connected to a plurality of scan lines GWLi, GCLi, GILi, GBLi, and GRLi, a data line DLj, an emission line ESLi, and a plurality of power supply voltage lines VDL, VSL, VIL1, VIL2, VRL, and VCL. The pixel driving unit PDC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 are N-type will be described as an example. However, the inventive concept is not limited thereto, and some of the first to eighth transistors T1 to T8 may be N-type transistors and others may be P-type transistors, and each of the first to eighth transistors T1 to T8 may be a P-type transistor, and is not limited to one embodiment.

A gate of the first transistor T1 may be connected to the first node N1. The first electrode of the first transistor T1 may be connected to the second node N2 and the second electrode may be connected to the third node N3. The first transistor T1 may be a driving transistor. The first transistor T1 may control the driving current ILD flowing from the first power supply line VDL to the second power supply line VSL via the light emitting element LD in response to the voltage of the first node N1. In this case, the first power supply voltage VDD may be set to a voltage having a higher potential than potential of the second power supply voltage VSS.

As used herein, "electrically connected between a transistor and a signal line or a transistor and a transistor" means "a transistor in which the source, drain, and gate have an integral shape with the signal line or are connected through a connection electrode".

The second transistor T2 may include a gate connected to the write scan line GWLi, a first electrode connected to the data line DLj, and a second electrode connected to the first node N1. The second transistor T2 may supply the data signal DATA to the first node N1 in response to the write scan signal GW transmitted through the write scan line GWLi. The second transistor T2 is turned on when the write scan signal GW is supplied to the write scan line GWLi to electrically connect the data line DLj and the first node N1.

The third transistor T3 may be connected between the first node N1 and the reference voltage line VRL. A first electrode of the third transistor T3 may receive the reference voltage VREF through the reference voltage line VRL, and a second electrode of the third transistor T3 may be connected to the first node N1. In this embodiment, the gate of the third transistor T3 may receive the reset scan signal GR through the i-th fifth scan line GRLi (hereinafter referred to as a fifth scan line). The third transistor T3 is turned on when the reset scan signal GR is supplied to the reset scan line GRLi, and may provide the reference voltage VREF to the first node N1.

The fourth transistor T4 may be connected between the third node N3 and the first initialization voltage line VIL1. The first electrode of the fourth transistor T4 may be connected to the third node N3, and a second electrode of the fourth transistor T4 may be connected to a first initialization voltage line VIL1 providing a first initialization voltage VINT1. The fourth transistor T4 may be referred to as a first initialization transistor. The gate of the fourth transistor T4 may receive the first initialization scan signal GI through the i-th third scan line GILi (hereinafter referred to as a third scan line). The fourth transistor T4 is turned on when the first initialization scan signal GI is supplied to the first initialization scan line GILi to supply the first initialization voltage VINT1 to the third node N3.

The fifth transistor T5 may be connected between the compensation voltage line VCL and the second node N2. The first electrode of the fifth transistor T5 may receive the compensation voltage VCOMP through the compensation voltage line VCL, and the second electrode of the fifth transistor T5 may be connected to the second node N2 and electrically connected to the first electrode of the first transistor T1. The gate of the fifth transistor T5 may receive the compensation scan signal GC through the i-th second scan line GCLi (hereinafter referred to as a second scan line). The fifth transistor T5 is turned on when the compensation scan signal GC is supplied to the compensation scan line GCLi to provide the compensation voltage VCOMP to the second node N2, and during the compensation period, the threshold voltage of the first transistor T1 may be compensated.

The sixth transistor T6 may be connected between the first transistor T1 and the light emitting element LD. Specifically, the gate of the sixth transistor T6 may receive the emission signal EM through the i-th emission line ESLi (hereinafter referred to as an emission line). The first electrode of the sixth transistor T6 is connected to the cathode of the light emitting element LD through the fourth node N4, and the second electrode of the sixth transistor T6 may be connected to the first electrode of the first transistor T1 through the second node N2. The sixth transistor T6 may be referred to as a first emission control transistor. When the emission signal EM is supplied to the emission line ESLi, the sixth transistor T6 is turned on and electrically connects the light emitting element LD with the first transistor T1.

The seventh transistor T7 may be connected between the second power supply line VSL and the third node N3. The first electrode of the seventh transistor T7 is connected to the second electrode of the first transistor T1 through the third node N3, and the second electrode of the seventh transistor T7 may receive the second power supply voltage VSS through the second power supply line VSL. A gate of the seventh transistor T7 may be electrically connected to the emission line ESLi. The seventh transistor T7 may be referred to as a second emission control transistor. The seventh transistor T7 is turned on when the emission signal EM is supplied to the emission line ESLi, and electrically connects the second electrode of the first transistor T1 to the second power supply line VSL.

Meanwhile, in the present embodiment, the sixth transistor T6 and the seventh transistor T7 are connected to the same emission line ESLi and turned on through the same emission signal EM and this is shown as an example, and the sixth transistor T6 and the seventh transistor T7 may be independently turned on by different signals that are distinct from each other. Also, in the pixel driving unit PDC according to an embodiment of the inventive concept, either the sixth transistor T6 or the seventh transistor T7 may be omitted.

The eighth transistor T8 may be connected between the second initialization voltage line VIL2 and the fourth node N4. That is, the eighth transistor T8 may include a gate connected to the i-th fourth scan line GBLi (hereinafter referred to as a fourth scan line), a first electrode connected to the second initialization voltage line VIL2, and a second electrode connected to the fourth node N4. The eighth transistor T8 may be referred to as a second initialization transistor. The eighth transistor T8 may supply the second initialization voltage VINT2 to the fourth node N4 corresponding to the cathode of the light emitting element LD in response to the second initialization scan signal GB transmitted through the second initialization scan line GBLi. A cathode of the light emitting element LD may be initialized by the second initialization voltage VINT2.

Meanwhile, in the present embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may be operated by the same compensation scan signal GC. The eighth transistor T8 and the fifth transistor T5 may be simultaneously turned on/off by the same compensation scan signal GC. In this case, the compensation scan line GCLi and the second initialization scan line GBLi may be substantially provided as a single scan line. Accordingly, initialization of the cathode of the light emitting element LD and threshold voltage compensation of the first transistor T1 may be performed at the same timing. However, this is shown as an example and is not limited to any one embodiment.

Also, according to the inventive concept, the cathode initialization of the light emitting element LD and the threshold voltage compensation of the first transistor T1 may be performed by applying the same power supply voltage. For example, the compensation voltage line VCL and the second initialization voltage line VIL2 may be substantially provided as a single power supply voltage line. In this case, the cathode initialization operation and the driving transistor compensation operation may be performed with one power supply voltage, and thus the driving unit design may be simplified. However, this is shown as an example and is not limited to any one embodiment.

The first capacitor C1 may be disposed between the first node N1 and the third node N3. The first capacitor C1 may store a difference voltage between the first node N1 and the third node N3. The first capacitor C1 may be referred to as a storage capacitor.

The second capacitor C2 may be disposed between the third node N3 and the second power supply line VSL. That is, one electrode of the second capacitor C2 may be connected to the second power supply line VSL receiving the second power supply voltage VSS, and the other electrode of the second capacitor C2 may be connected to the third node N3. The second capacitor C2 may store charge corresponding to a voltage difference between the second power supply voltage VSS and the second node N2. The second capacitor C2 may be referred to as a hold capacitor. The second capacitor C2 may have a higher storage capacity than the first capacitor C1. Accordingly, the second capacitor C2 may minimize the voltage change of the third node N3 in response to the voltage change of the first node N1.

In this embodiment, the light emitting element LD may be connected to the pixel driving unit PDC through the fourth node N4. The light emitting element LD may include an anode connected to the first power supply line VDL and a cathode opposite to the anode. In this embodiment, the light emitting element LD may be connected to the pixel driving unit PDC through a cathode. That is, in the pixel PXij according to the inventive concept, a connection node to which the light emitting element LD and the pixel driving unit PDC are connected may be a fourth node N4, and the fourth node N4 may correspond to a connection node between the first electrode of the sixth transistor T6 and the cathode of the light emitting element LD. Accordingly, the potential of the fourth node N4 may substantially correspond to the potential of the cathode of the light emitting element LD.

Specifically, the anode of the light emitting element LD is connected to the first power supply line VDL, and a first power supply voltage VDD, which is a constant voltage, is applied, and the cathode may be connected to the first transistor T1 through the sixth transistor T6. That is, in this embodiment in which the first to eighth transistors T1 to T8 are N-type transistors, the potential of the third node N3 corresponding to the source of the driving transistor, the first transistor T1, may not be directly affected by the characteristics of the light emitting element LD. Therefore, even if deterioration of the light emitting element LD occurs, the effect on the gate-source voltage Vgs of the transistors constituting the pixel driving unit PDC, particularly the driving transistor, may be reduced. That is, since the amount of change in driving current due to deterioration of the light emitting element LD may be reduced, afterimage defects of the display panel may be reduced and lifespan of the display panel may be improved due to an increase in usage time.

Alternatively, as shown in FIG. 2B, the pixel PXij-1 may include a pixel driving unit PDC-1 including two transistors T1 and T2 and one capacitor C1. The pixel driving unit PDC-1 may be connected to a light emitting element LD, a write scan line GWLi, a data line DLj, and a second power supply line VSL. The pixel driving unit PDC-1 shown in FIG. 2B may correspond to the case where the third to eighth transistors T3 to T8 and the second capacitor C2 are omitted from the pixel driving unit PDC shown in FIG. 2A.

Each of the first and second transistors T1 and T2 may be N-type or P-type. In this embodiment, each of the first and second transistors T1 and T2 will be exemplarily described as an N-type transistor.

The first transistor T1 may include a gate connected to the first node N1, a first electrode connected to the second node N2, and a second electrode connected to the third node N3. The second node N2 may be a node connected to the first power supply line VDL side, and the third node N3 may be a node connected to the second power supply line VSL side. The first transistor T1 is connected to the light emitting element LD through the second node N2 and connected to the second power supply line VSL through the third node N3. The first transistor T1 may be a driving transistor.

The second transistor T2 may include a gate receiving the write scan signal GW through the write scan line GWLi, a first electrode connected to the data line DLj, and a second electrode connected to the first node N1. The second transistor T2 may supply the data signal DATA to the first node N1 in response to the write scan signal GW transmitted through the write scan line GWLi.

The capacitor C1 may include an electrode connected to the first node N1 and an electrode connected to the third node N3. The capacitor C1 may store the data signal DATA transmitted to the first node N1.

The light emitting element LD may include an anode and a cathode. In this embodiment, the anode of the light emitting element LD may be connected to the first power supply line VDL, and the cathode may be connected to the pixel driving unit PDC-1 through the second node N2. In this embodiment, a cathode of the light emitting element LD may be connected to the first transistor T1. The light emitting element LD may emit light in response to the amount of current flowing through the first transistor T1 of the pixel driving unit PDC-1.

In this embodiment in which the first and second transistors T1 and T2 are N-type transistors, the second node N2 to which the cathode of the light emitting element LD and the pixel driving unit PDC-1 are connected may correspond to the drain of the first transistor T1. That is, a change in the gate-source voltage Vgs of the first transistor T1 due to the light emitting element LD may be prevented. Accordingly, since the amount of change in driving current due to deterioration of the light emitting element LD may be reduced, afterimage defects of the display panel may be reduced and lifespan of the display panel may be improved due to an increase in usage time.

Meanwhile, FIGS. 2A and 2B show circuits for pixel driving units PDC and PDC-1 according to an embodiment of the inventive concept, and in relation to a display panel according to an embodiment of the inventive concept, if the circuit is connected to the cathode of the light emitting element LD, the number or arrangement of transistors and the number or arrangement of capacitors may be designed in various ways, and this is not limited to any one embodiment.

Figure 3A:
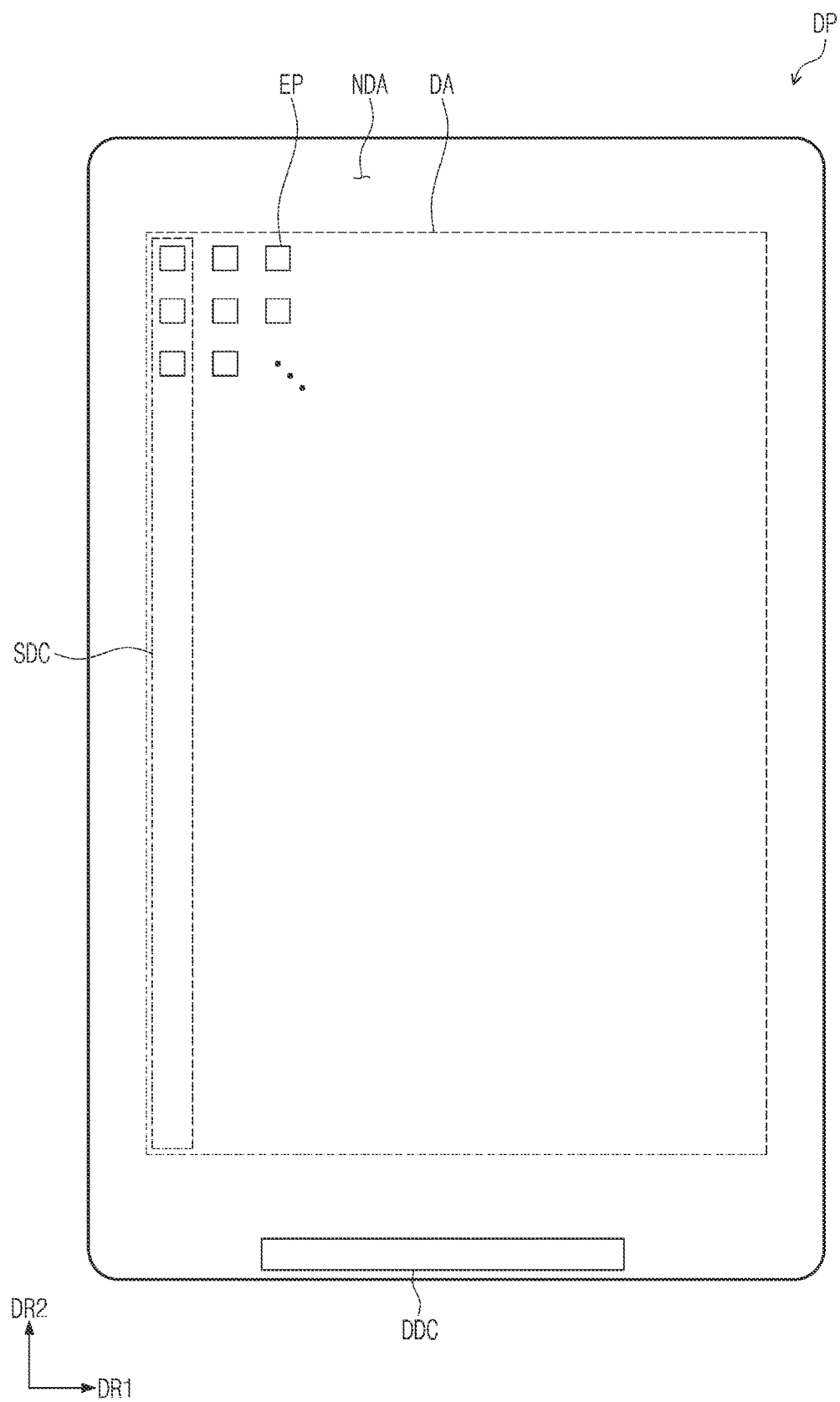
FIG. 3A is a plan view schematically illustrating a display panel according to an embodiment of the inventive concept.
Figure 3B:
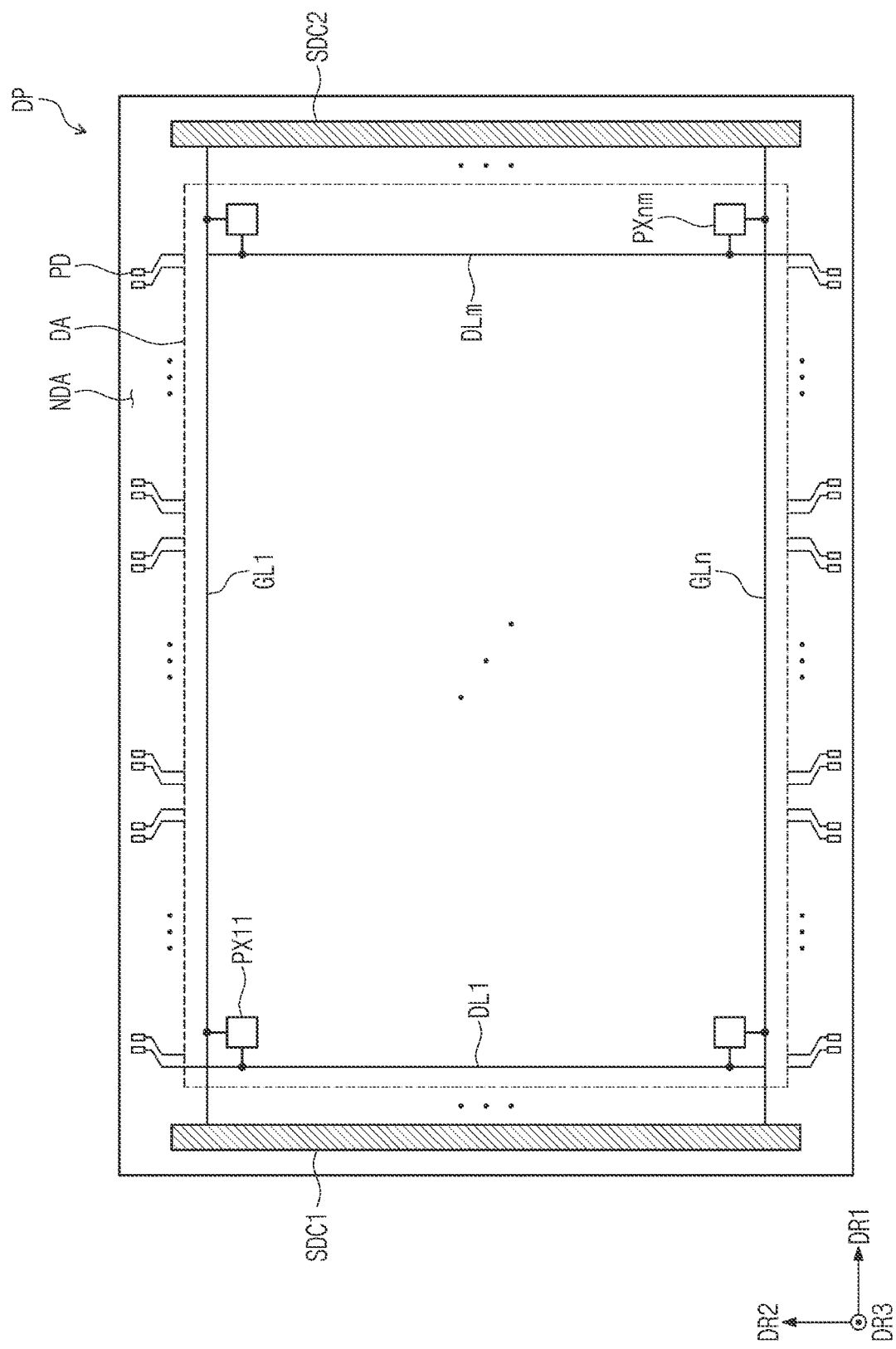
FIG. 3B is a plan view schematically illustrating a display panel according to an embodiment of the inventive concept.

FIGS. 3A and 3B are plan views schematically illustrating a display panel according to an embodiment of the inventive concept. In each of FIGS. 3A and 3B, some components are omitted. Hereinafter, the inventive concept will be described with reference to FIGS. 3A and 3B. Referring to FIG. 3A, the display panel DP according to an embodiment may be divided into a display area DA and a peripheral area NDA (or non-display area NDA). The display area DA may include a plurality of light emitting units EP.

The light emitting units EP may be areas respectively emitting light by the pixels PXij (see FIG. 1). Specifically, each of the light emitting units EP may correspond to an emission opening OP-PDL (see FIG. 5) to be described later.

The peripheral area NDA may be disposed adjacent to the display area DA. In this embodiment, the peripheral area NDA is shown as a shape surrounding the edge of the display area DA. However, this is shown as an example, and the peripheral area NDA may be disposed on one side of the display area DA or may be omitted, and is not limited to any one embodiment.

In this embodiment, the scan driving unit SDC and the data driving unit DDC may be mounted on the display panel DP. In one embodiment, a scan driving unit SDC may be disposed in a display area DA, and a data driving unit DDC may be disposed in a peripheral area NDA. The scan driving unit SDC may overlap at least a portion of the plurality of light emitting units EP disposed in the display area DA. As the scan driving unit SDC is placed in the display area DA, compared to a conventional display panel in which a scan driving unit is disposed in the peripheral area, the peripheral area NDA area may be reduced, and a display device with a thin bezel may be easily implemented.

Meanwhile, unlike shown in FIG. 3A, the scan driving unit SDC may be provided in two distinct parts. The two scan driving units SDC may be disposed left and right with the center of the display area DA therebetween. Alternatively, two or more scan driving units SDC may be provided, and the number of scan driving units SDC is not limited to any one embodiment.

Meanwhile, FIG. 3A illustrates an example of a display panel, and a data driving unit DDC may be disposed in a display area DA. In this case, some of the light emitting units EP disposed in the display area DA may overlap the data driving unit DDC.

In one embodiment, the data driving unit DDC may be provided in the form of a separate driving chip independent of the display panel DP and connected to the display panel DP. However, this is described as an example, and the data driving unit DDC may be formed in the same process as the scan driving unit SDC to configure the display panel DP, and is not limited to one embodiment.

As shown in FIG. 3B, the display panel DP may have a shape in which a length corresponding to the first direction DR1 is longer than a length corresponding to the second direction DR2. In this embodiment, the display panel DP may include a plurality of scan driving units SDC1 and SDC2. The scan driving units SDC1 and SDC2 are illustrated as including a first scan driving unit SDC1 and a second scan driving unit SDC2 spaced apart from each other in the first direction DR1.

The first scan driving unit SDC1 may be connected to some of the scan lines GL1 to GLn, and the second scan driving unit SDC2 may be connected to other parts of the scan lines GL1 to GLn. For example, the first scan driving unit SDC1 may be connected to odd-numbered scan lines among the scan lines GL1 to GLn, and the second scan driving unit SDC2 may be connected to even-numbered scan lines among the scan lines GL1 to GLn.

FIG. 3B shows the pads PD of the data lines DL1 to DLm. The pads PD may be defined at ends of the data lines DL1 to DLm. The data lines DL1 to DLm may be connected to the data driving unit DDC (see FIG. 3A) through the pads PD.

According to the inventive concept, the pads PD may be divided and arranged at positions spaced apart from each other with the display area DA therebetween in the peripheral area NDA. For example, some of the pads PD are disposed on the upper side, that is, on the side adjacent to the first scan line GL1 among the scan lines GL1 to GLn, and other some of the pads PD may be disposed on a lower side, that is, on a side adjacent to the last scan line GLn among the scan lines GL1 to GLn. In this embodiment, pads PD connected to odd-numbered data lines among the data lines DL1 to DLm may be disposed on the upper side, and pads PD connected to even-numbered data lines among the data lines DL1 to DLm may be disposed on the lower side.

Although not shown in the drawing, the display panel DP may include a plurality of upper data driving units connected to the pads PD disposed on the upper side and/or a plurality of lower data driving units connected to the pads PD disposed on the lower side. However, this is an example, and the display panel DP may include one upper data driving unit connected to the pads PD disposed on the upper side and/or one lower data driving unit connected to the pads PD disposed on the lower side. That is, the pads PD according to an embodiment of the inventive concept may be disposed on only one side of the display panel DP and connected to a single data driving unit, and are not limited to one embodiment.

Also, as described above in FIG. 3A, in the display panel DP in FIG. 3B, a scan driving unit and/or a data driving unit may be disposed in the display area DA, and accordingly, some of the light emitting units disposed in the display area DA may overlap the scan driving unit and/or the data driving unit.

Figure 4A:
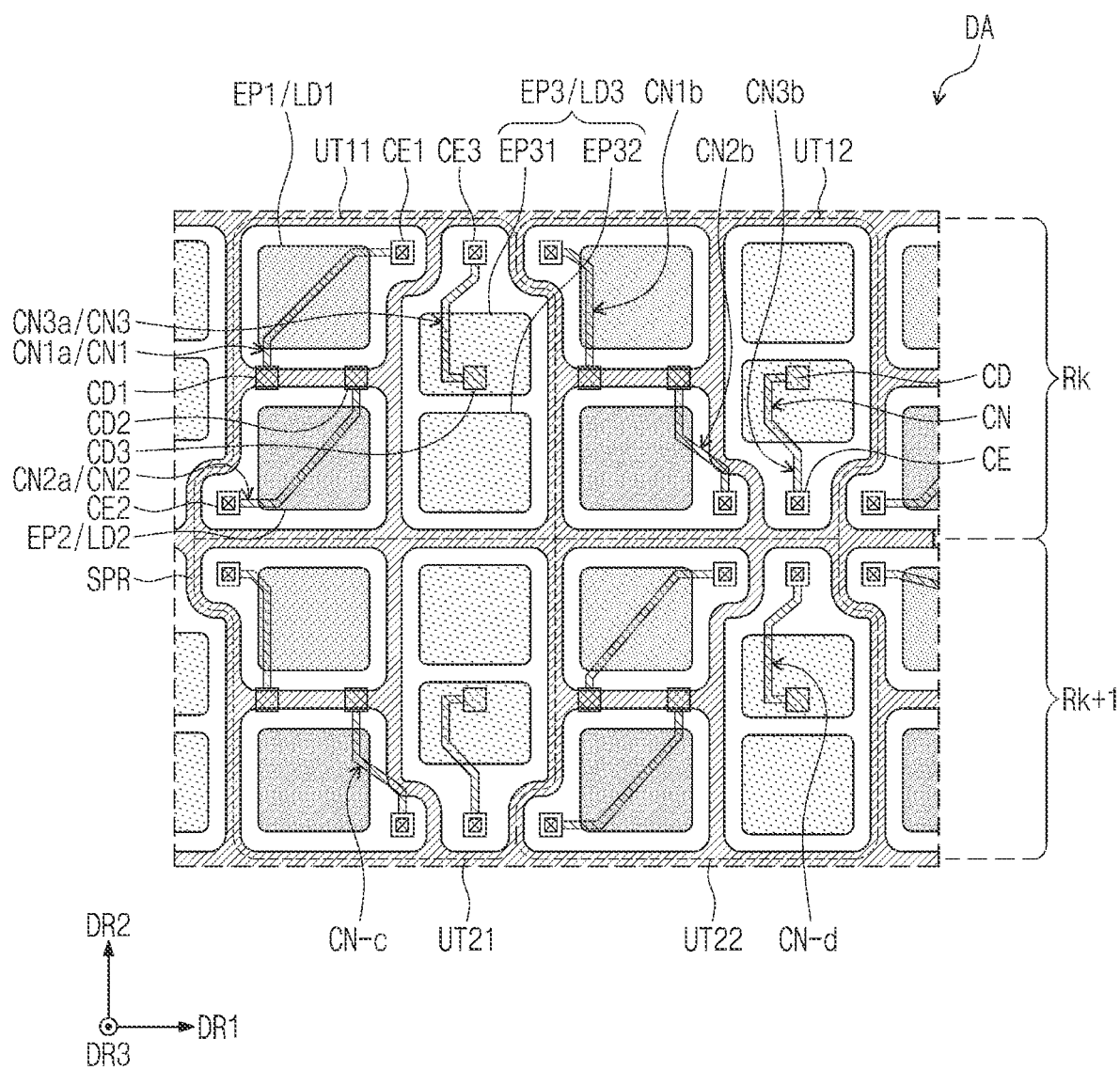
FIGS. 4A to 4C are enlarged plan views of a partial area of a display panel according to an embodiment.
Figure 4B:
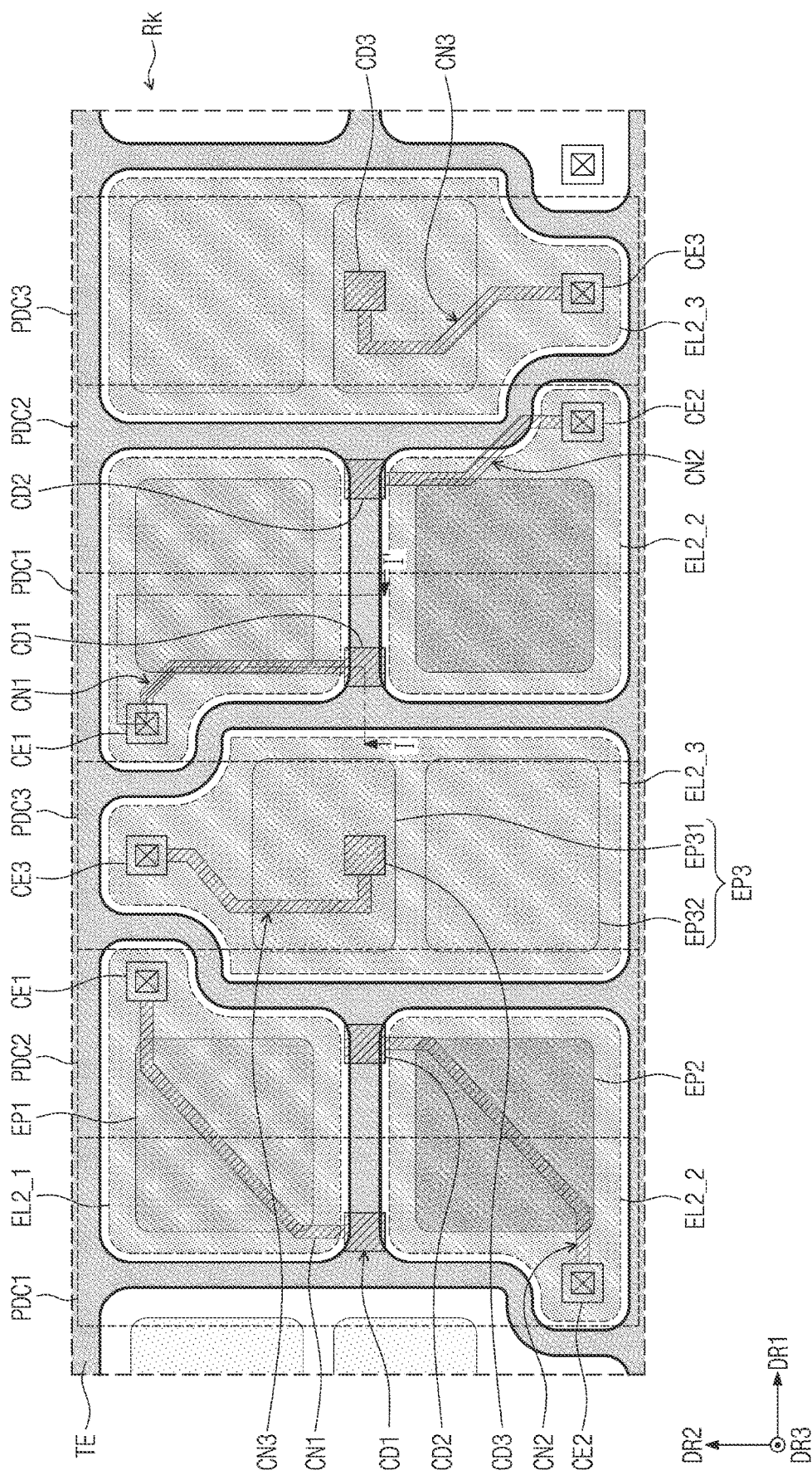
Figure 4C:
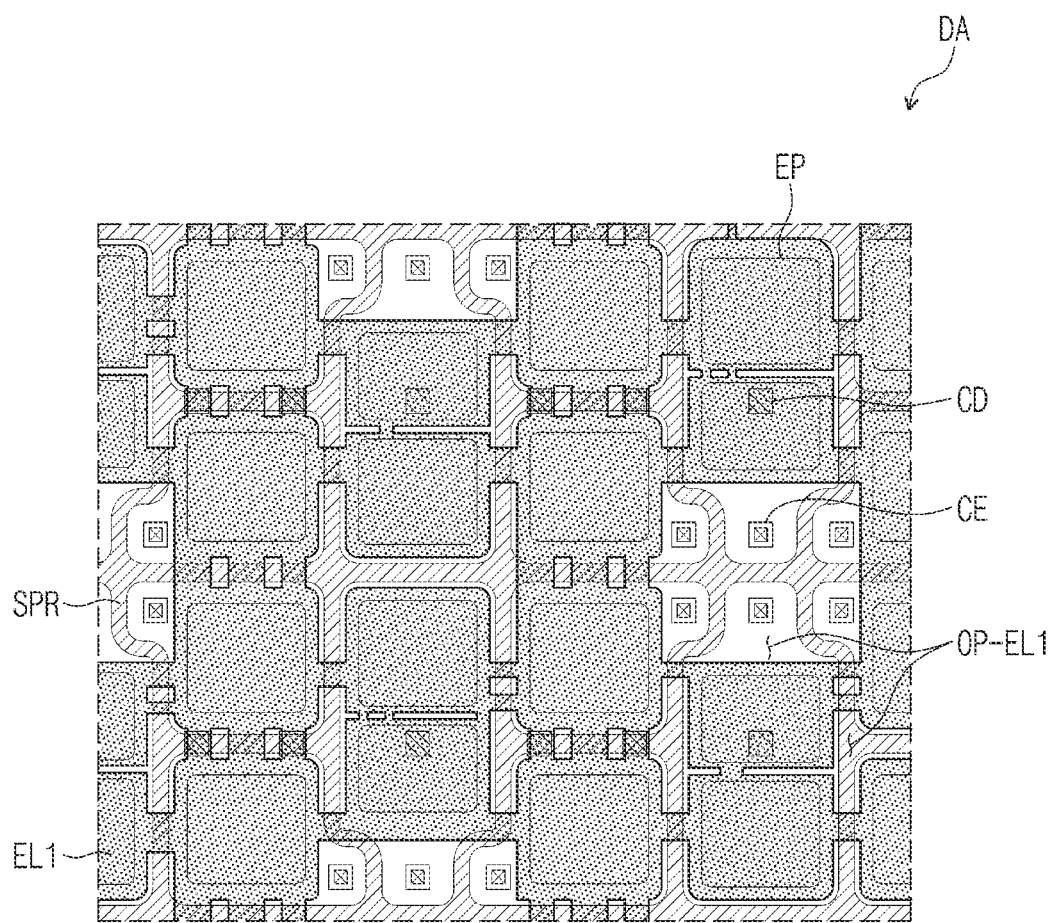

FIGS. 4A to 4C are enlarged plan views of a partial area of a display panel according to an embodiment. FIG. 4A shows an area where a total of four light emitting units UT11, UT12, UT21, and UT22 in two rows and two columns are disposed, and FIG. 4B shows an enlarged view of a partial area shown in FIG. 4A. In FIG. 4C, some of the components shown in FIG. 4A are omitted or emphasized. Hereinafter, the inventive concept will be described with reference to FIGS. 4A to 4C.

FIG. 4A shows light emitting units UT11, UT12, UT21, and UT22 in two rows and two columns. The light emitting units of the first row Rk include light emitting units constituting the first row and first column light emitting unit UT11 and the first row and second column light emitting unit UT12, and the light emitting units of the second row Rk+1 include light emitting units constituting the second row and first column light emitting units UT21 and the second row and second column light emitting units UT22. FIG. 4B shows the first row Rk light emitting units. FIGS. 4A to 4C show a separator SPR, a plurality of light emitting units EP1, EP2, and EP3 disposed in the area partitioned by the separator SPR, connection wirings CN1, CN2, and CN3, a first electrode EL1, and second electrodes EL2_1, EL2_2, and EL2_3 among the components of the display panel.

As described above, each of the light emitting units EP1, EP2, and EP3 may correspond to an emission opening OP-PDL (see FIG. 5) to be described later. That is, each of the light emitting units EP1, EP2, and EP3 may be areas in which light is emitted by the above-described light emitting element, and may correspond to a unit constituting an image displayed on the display panel DP. More specifically, each of the light emitting units EP1, EP2, and EP3 may correspond to an area defined by the emission opening OP-PDL (see FIG. 5) described later, particularly an area defined by a lower surface of the emission opening OP-PDL.

The light emitting units EP1, EP2, and EP3 may include a first light emitting unit EP1, a second light emitting unit EP2, and a third light emitting unit EP3. The first light emitting unit EP1, the second light emitting unit EP2, and the third light emitting unit EP3 may emit lights of different color lights from each other. Therefore, the first light emitting element LD1 constituting the first light emitting unit EP1, the second light emitting element LD2 constituting the second light emitting unit EP2, and the third light emitting element LD3 constituting the third light emitting unit EP3 may emit lights of different colors. For example, the first light emitting unit EP1 may emit red light, the second light emitting unit EP2 may emit green light, and the third light emitting unit EP3 may emit blue light, although the combination of colors is not limited thereto. Also, two or more of the light emitting units EP1, EP2, and EP3 may emit light of the same color. For example, all of the first to third light emitting units EP1, EP2, and EP3 may emit blue light or all of them may emit white light.

In FIG. 4A, the third light emitting unit EP3 displaying light emitted by the third emission element may include two sub light emitting units EP31 and EP32 spaced apart from each other in the second direction DR2. However, this is an example and not a limitation. Like the other light emitting units EP1 and EP2, the third light emitting unit EP3 may be provided in one pattern having an integral shape, and at least one of the other light emitting units EP1 and EP2 may include spaced apart sub light emitting units.

In this embodiment, the first row Rk light emitting units may be composed of light emitting units in which a first row and first column light emitting unit UT11 and a first row and second column light emitting unit UT12 are arranged in a repeating pattern. The light emitting units of the second row Rk+1 may be composed of light emitting units having a shape and arrangement that make them axisymmetric with the light emitting units of the first row Rk with respect to an axis parallel to the first direction DR1 extending between the first row Rk and the second row Rk+1. Accordingly, the light emitting units constituting the first row and first column light emitting unit UT11 and the first row and second column light emitting unit UT12 and the connection parts of the connection wiring are symmetrical in shape and arrangement with the light emitting units constituting the second row and first column light emitting units UT21 and the second row and second column light emitting units UT22 and the connection parts of connection wirings, with respect to an axis extending in the first direction DR1 between the two rows Rk and Rk+1.

Hereinafter, the first row and first column light emitting unit UT11 will be described. FIG. 4B illustrates a plurality of second electrodes EL2_1, EL2_2, and EL2_3, a plurality of pixel driving units PDC1, PDC2, PDC3, and a plurality of connection wirings CN1, CN2, CN3 for easy description. The second electrodes EL2_1, EL2_2, and EL2_3 may be electrically disconnected from each other by being separated from each other by the separator SPR (see FIG. 4C). In this embodiment, one light emitting unit UT11 may include three light emitting units EP1, EP2, and EP3. Accordingly, the light emitting unit UT11 may include three second electrodes EL2_1, EL2_2, and EL2_3 (hereinafter referred to as first to third cathodes), three pixel driving units PDC1, PDC2, and PDC3, and three connection wirings CN1, CN2, and CN3. However, this is shown as an example, and the number and arrangement of light emitting units may be designed in various ways and are not limited to any one embodiment.

The first to third pixel driving units PDC1, PDC2, and PDC3 are electrically connected to the light emitting elements LD1, LD2, and LD3 constituting the first to third light emitting units EP1, EP2, and EP3, respectively. In this specification, "connected" includes not only a case of being physically connected by direct contact, but also a case of being electrically connected.

In addition, as shown in FIG. 4B, each area in which the pixel driving units PDC1, PDC2, and PDC3 are defined may correspond to a unit in which transistor and capacitor elements constituting a pixel driving unit PDC (see FIG. 2A) for driving a light emitting element of a pixel are repeatedly arranged.

The first to third pixel driving units PDC1, PDC2, and PDC3 may be sequentially disposed along the first direction DR1. Meanwhile, the arrangement positions of the first to third pixel driving units PDC1, PDC2, and PDC3 may be independently designed regardless of the positions or shapes of the first to third light emitting units EP1, EP2, and EP3.

For example, the first to third pixel driving units PDC1, PDC2, and PDC3 may be disposed in an area defined by being partitioned by a separator, that is, disposed at a position different from the position at which the first to third cathodes EL2_1, EL2_2, and EL2_3 are disposed, or may be designed to have an area of a shape different from that of the first to third cathodes EL2_1, EL2_2, and EL2_3. Alternatively, the first to third pixel driving units PDC1, PDC2, and PDC3 may be disposed to overlap positions where the first to third light emitting units EP1, EP2, and EP3 exist, respectively, and may be designed to have an area defined by being partitioned by a separator, for example, an area similar to that of the first to third cathodes EL2_1, EL2_2, and EL2_3.

In this embodiment, each of the first to third pixel driving units PDC1, PDC2, and PDC3 is shown in a rectangular shape, each of the first to third light emitting units EP1, EP2, and EP3 is arranged in a smaller area and a different shape, and the first to third cathodes EL2_1, EL2_2, and EL2_3 are disposed at overlapping positions with the first to third light emitting units EP1, EP2, and EP3, but are illustrated in irregular shapes.

Accordingly, as shown in FIG. 4B, the first pixel driving unit PDC1 may be disposed at a position partially overlapping the first light emitting unit EP1, the second light emitting unit EP2, and any other adjacent light emitting units. The second pixel driving unit PDC2 may be disposed at a position overlapping the first light emitting unit EP1, the second light emitting unit EP2, and the third light emitting unit EP3. The third pixel driving unit PDC3 may be disposed at a position overlapping the third light emitting unit EP3. On the other hand, this is shown as an example, the positions of the first to third pixel driving units PDC1, PDC2, and PDC3 may be designed in various shapes and arrangements independently of the light emitting units EP1, EP2, and EP3, and are not limited to any one embodiment.

Referring to FIGS. 4A and 4B, a plurality of connection wirings CN may be provided and arranged spaced apart from each other. The connection wiring CN may electrically connect the pixel driving unit and the light emitting element. Specifically, the connection wiring CN may correspond to a node (refer to N4 in FIG. 2A or N2 in FIG. 2B) where the light emitting element LD is connected to the pixel driving unit PDC.

The connection wiring CN may include a first connection part (or emission connection part CE) and a second connection part (or driving connection part CD). The emission connection part CE may be provided on one side of the connection wiring CN and the driving connection part CD may be provided on the other side of the connection wiring CN.

The driving connection part CD may be a part connected to a pixel driving unit PDC of the connection wiring CN. In this embodiment, a driving connection part CD may be connected to one electrode of a transistor constituting a pixel driving unit PDC. Specifically, the driving connection part CD may be connected to the drain of the sixth transistor T6 shown in FIG. 2A or the drain of the first transistor T1 shown in FIG. 2B. Accordingly, the position of the driving connection part CD may correspond to the position of the transistor TR (see FIG. 5) physically connected to the connection wiring CN of the pixel driving unit. The emission connection part CE may be a part connected to a light emitting element of the connection wiring CN. In this embodiment, the emission connection part CE may be connected to the second electrode EL2 (hereinafter referred to as cathode) of the light emitting element.

The light emitting unit UT11 may include first to third connection wirings CN1, CN2, and CN3. The first connection wiring CN1 may connect the first light emitting element LD1 forming the first light emitting unit EP1 and the first pixel driving unit PDC1, the second connection wiring CN2 may connect the second light emitting element LD2 forming the second light emitting unit EP2 and the second pixel driving unit PDC2, and the third connection wiring CN3 may connect the third light emitting element LD3 forming the third light emitting unit EP3 and the third pixel driving unit PDC3.

Specifically, the first to third connection wirings CN1, CN2, and CN3 may connect the first to third cathodes EL2_1, EL2_2, and EL2_3 and the first to third pixel driving units PDC1, PDC2, and PDC3, respectively. The first connection wiring CN1 may include a first driving connection part CD1 connected to the first pixel driving unit PDC1 and a first emission connection part CE1 connected to the first cathode EL2_1. The second connection wiring CN2 may include a second driving connection part CD2 connected to the second pixel driving unit PDC2 and a second emission connection part CE2 connected to the second cathode EL2_2. The third connection wiring CN3 may include a third driving connection part CD3 connected to the third pixel driving unit PDC3 and a third emission connection part CE3 connected to the third cathode EL2_3.

The first to third driving connection parts CD1, CD2, and CD3 may be aligned along the first direction DR1. As described above, the first to third driving connection parts CD1, CD2, and CD3 may correspond to positions of connection transistors constituting the first to third pixel driving units PDC1, PDC2, and PDC3, respectively. In one pixel, the connection transistor may be a transistor including a connection node to which a pixel driving unit and a light emitting element are connected as one electrode, and for example, may correspond to the sixth transistor T6 of FIG. 2A or the first transistor T1 of FIG. 2B. According to the inventive concept, regardless of the shape or size of the light emitting unit and the emission color, it is possible to configure and design the shape, location, and arrangement of the pixel driving unit of all pixels.

In this embodiment, the first to third emission connection parts CE1, CE2, and CE3 may be disposed at positions that do not overlap with the light emitting units EP1, EP2, and EP3. As described below, since the emission connection part CE (see FIG. 5) of the connection wiring CN is the part where the light emitting element LD (see FIG. 5) is connected and the tip part TP (see FIG. 5) is defined, it may be provided at a position that does not overlap with the emission opening OP-PDL (see FIG. 5). That is, in each of the cathodes EL2_1, EL2_2, and EL2_3, the emission connection parts CE1, CE2, and CE3 may be disposed at positions spaced apart from the light emitting units EP1, EP2, and EP3, and to connect with the connection wirings CN1, CN2, and CN3 at the location where the emission connection parts CE1, CE2, and CE3 are placed, the cathodes EL2_1, EL2_2, and EL2_3 may include partial areas protruding from the light emitting units EP1, EP2, and EP3.

For example, to connect to the first connection wiring CN1 at the position where the first emission connection part CE1 is disposed, the first cathode EL2_1 may include a protruding portion extending beyond the boundary of the first light emitting unit EP1, and the first emission connection part CE1 may be provided on the protruding portion.

In addition, the first driving connection part CD1, which is a position where the first pixel driving unit PDC1, in particular, the first connection wiring CN1, is connected to the transistor TR (see FIG. 5) may be defined at a position that does not overlap with the first light emitting unit EP1. According to the present embodiment, since the first connection wiring CN1 is disposed in the first light emitting unit EP1, the spaced first cathode EL2_1 and the first pixel driving unit PDC1 may be easily connected.

Meanwhile, the third driving connection part CD3, which is a position where the third pixel driving unit PDC3, particularly the third connection wiring CN3, is connected to the transistor TR may be defined at a position that does not overlap with the third emission connection part CE3 and disposed at a position that overlaps with the third light emitting unit EP3. According to the present embodiment, as the third cathode EL2_3 and the pixel driving unit PDC3 are connected through the third connection wiring CN3, in the design of the pixel driving unit PDC3, the restriction according to the position or shape of the third light emitting unit EP3 is reduced, so that the degree of freedom of design may be improved.

Referring back to FIG. 4A, the light emitting units of the second row Rk+1 may be composed of light emitting units having a shape and arrangement in which the first row light emitting units UT11 and UT12 are axisymmetric with respect to an axis parallel to the first direction DR1. At this time, due to the characteristics of the shape and arrangement of the first row light emitting units UT11 and UT12, the second row light emitting units UT21 and UT22 may be substantially composed of light emitting units formed by shifting the first row light emitting units UT11 and UT12 in the first direction DR1. That is, the light emitting units UT21 in the second row and first column may be composed of light emitting units having the same shape as the light emitting units UT12 in the first row and second column, and the second row and second column light emitting units UT22 may be composed of light emitting units having the same shape as the first row and first column light emitting units UT11.

Accordingly, the shape and arrangement of the connection wirings CN-c disposed in the second row and first column light emitting units UT21 may be the same as the connection wirings CN1b, CN2b, and CN3b disposed in the light emitting unit UT12 of the first row and second column. Similarly, the shapes and arrangements of the connection wirings CN-d disposed in the second row and second column light emitting units UT22 may be the same as the connection wirings CN1a, CN2a, and CN3a disposed in the first row and first column light emitting unit UT11.

Referring to FIGS. 4B and 4C, a sensing electrode TE may be disposed in an area overlapping the separator SPR. The sensing electrode TE is disposed in the display area DA to sense an external input. Details of the sensing electrode TE will be described later.

On the other hand, referring to FIG. 4B and FIG. 4C, the first electrode EL1 (hereinafter referred to as an anode) of the light emitting element according to an embodiment of the inventive concept may be provided in common to a plurality of light emitting units EP1, EP2, and EP3. That is, the anode EL1 may be formed as a single layer integral with the entire display area DA, and accordingly, the anode EL1 layer may be overlapped with the separator SPR. Alternatively, the anode EL1 of each of the light emitting elements may be formed as an independent conductive pattern spaced apart from each other, and may be electrically connected to each other through another conductive layer, and accordingly, the patterns of the anode EL1 may be disposed not to overlap with the separator SPR.

As described above, referring to FIG. 2A and FIG. 3A, a first power supply voltage VDD may be applied to the anode EL1 and a common voltage may be provided to all light emitting units. The anode EL1 may be connected to a first power supply line VDL (see FIG. 2A) providing a first power supply voltage VDD in the peripheral area NDA, or may be connected to the first power supply line VDL in the display panel DP, and is not limited to any one embodiment.

Meanwhile, a plurality of openings may be defined in the anode EL1 according to the present embodiment, and the openings may pass through the anode EL1 layer. The openings of the anode EL1 layer may be disposed at a position that does not overlap with the light emitting units EP, and may generally be defined at a position overlapping with the separator SPR. The openings may facilitate discharge of gas generated from an organic layer disposed below the anode EL1, for example, a sixth insulating layer 60 (see FIG. 5) described below. Accordingly, gas in the organic layer disposed below the light emitting element may be sufficiently discharged during the manufacturing process of the display panel, and gas discharged from the organic layer after manufacturing is reduced, and thus the rate at which the light emitting element is deteriorated may be reduced.

According to the inventive concept, by including a connection wiring between the light emitting element and the pixel driving unit, even if only the shape of the cathode is changed without changing the arrangement or shape of the light emitting units, the light emitting element may be easily connected to the pixel driving unit. Accordingly, design freedom for the arrangement of the pixel driving unit may be improved, and the area or resolution of the light emitting unit of the display panel may be easily increased.

Figure 5:
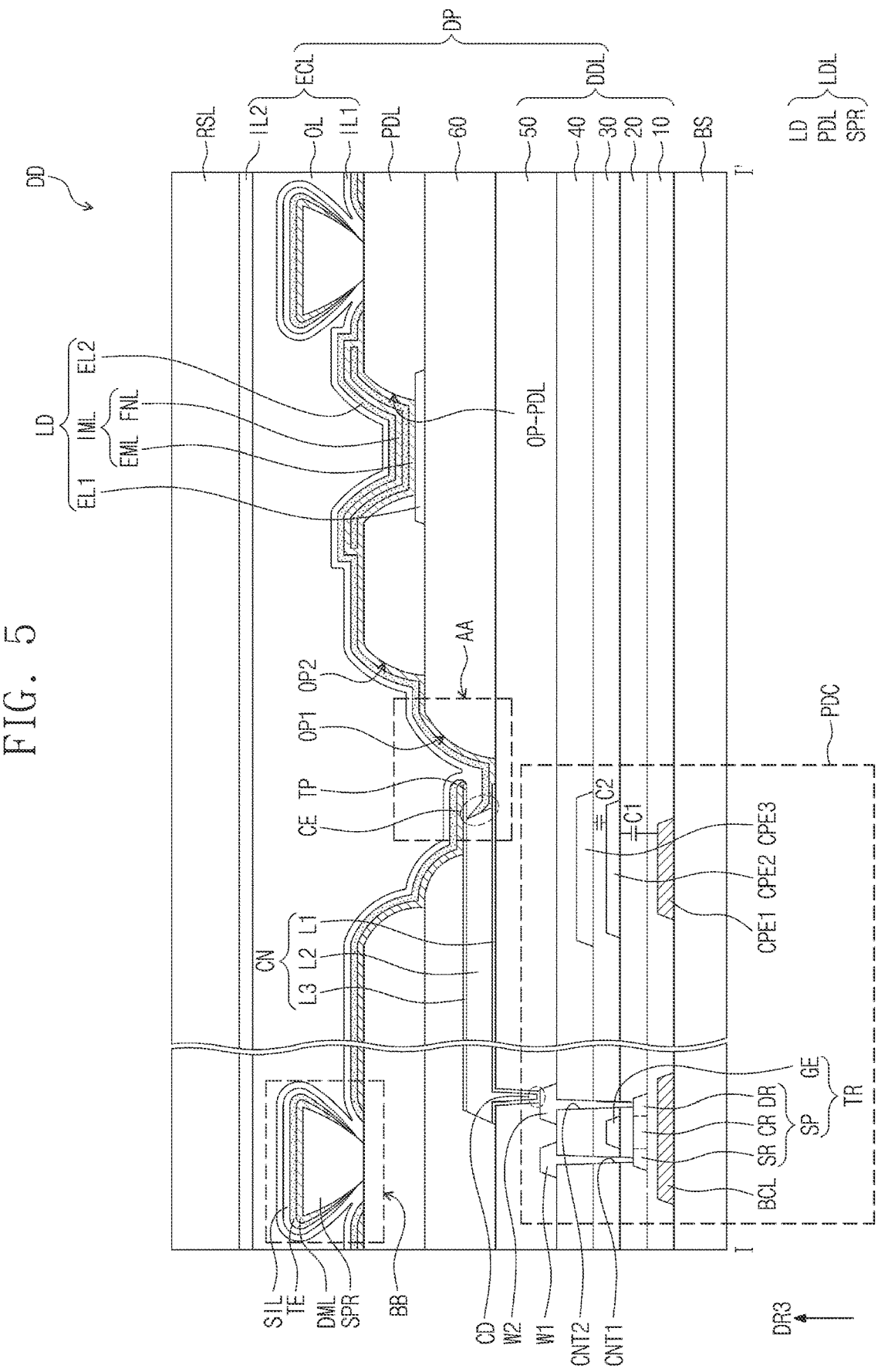
FIG. 5 is a cross-sectional view of the display device showing a portion corresponding to the line I-I' of FIG. 4B.
Figure 6A:
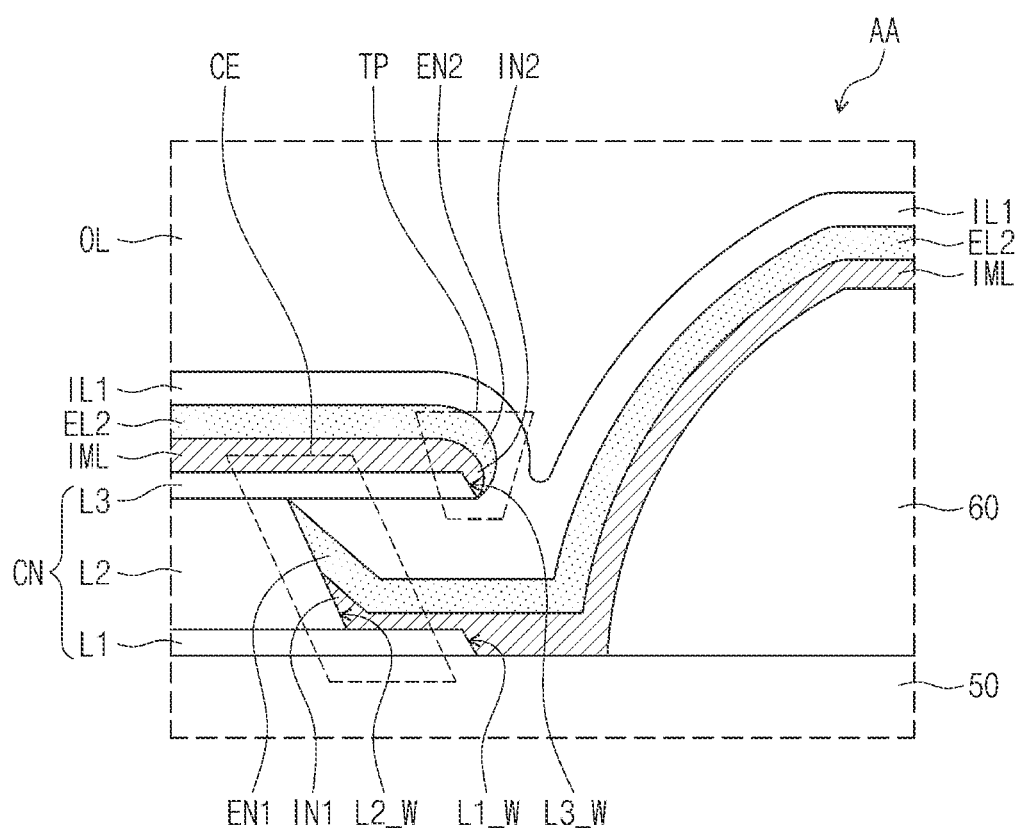
FIG. 6A is an enlarged view of an area AA of FIG. 5.
Figure 6B:
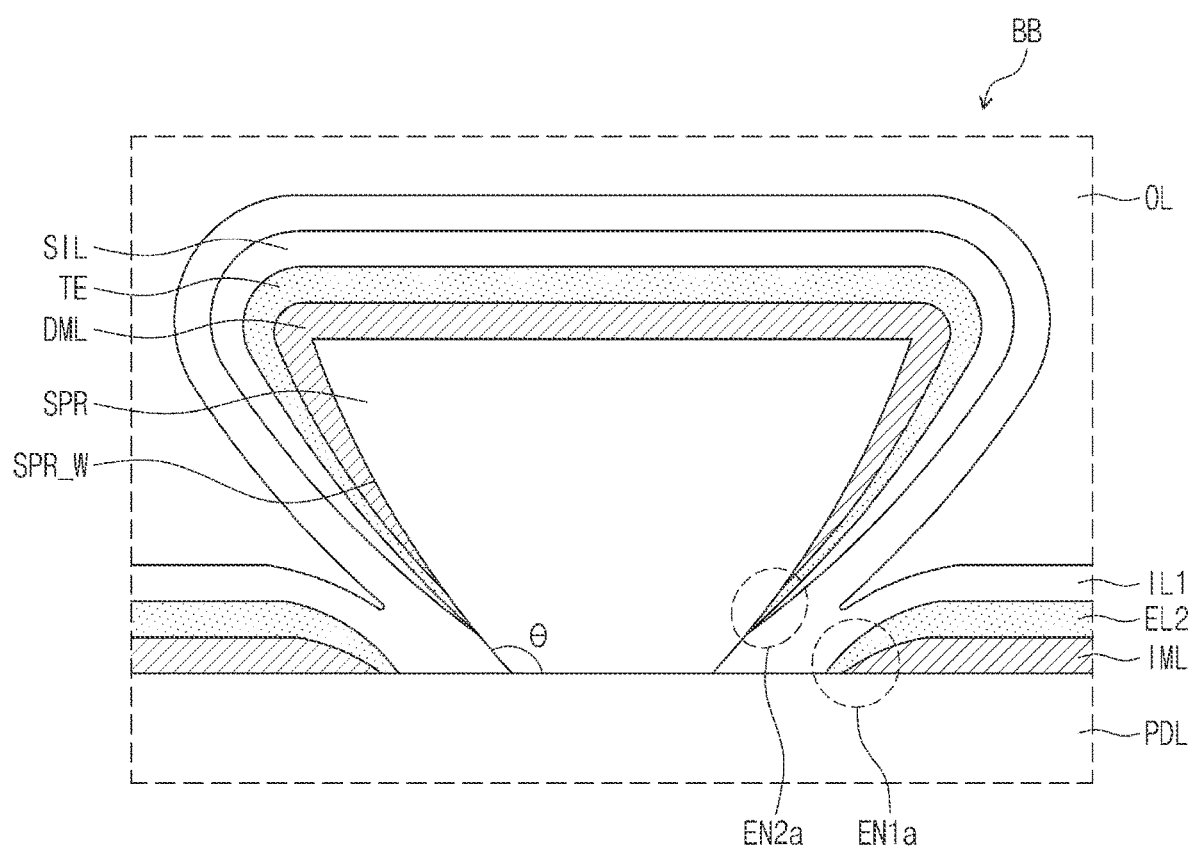
FIG. 6B is an enlarged view of the area BB of FIG. 5.

FIG. 5 is a cross-sectional view of a display panel according to an embodiment. FIG. 6A is an enlarged cross-sectional view of a partial area of a display panel according to an embodiment. FIG. 6B is an enlarged cross-sectional view of a partial area of a display panel according to an embodiment. FIG. 5 is a cross-sectional view showing a portion corresponding to the line I-I' of FIG. 4B. FIG. 6A shows an enlarged cross-sectional view of area AA of FIG. 5, and FIG. 6B shows an enlarged cross-sectional view of area BB of FIG. 5. Hereinafter, the inventive concept will be described with reference to FIGS. 5 to 6B.

Referring to FIG. 5, a display panel DP according to an embodiment may include a base layer BS, a driving element layer DDL, a light emitting element layer LDL, and an encapsulation layer ECL. The driving element layer DDL may include a plurality of insulating layers 10, 20, 30, 40, and 50 disposed on the base layer BS, and a plurality of conductive patterns and semiconductor patterns disposed between the insulating layers 10, 20, 30, 40, and 50. Conductive patterns and semiconductor patterns may be disposed between insulating layers to constitute a pixel driving unit PDC. FIG. 5 shows a cross-section of one area among areas where one light emitting unit is disposed for easy explanation.

The base layer BS may be a member providing a base surface on which a pixel driving unit PDC is disposed. The base layer BS may be a rigid substrate or a flexible substrate capable of bending, folding, rolling, or the like. The base layer BS may be a glass substrate, a metal substrate, or a polymer substrate. However, embodiments of the inventive concept are not limited thereto, and the base layer BS may include an inorganic layer, an organic layer, or a composite material layer.

The base layer BS may have a multi-layered structure. The base layer BS may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. In addition, the polymer resin layer may include at least one of acrylic resin, methacrylate resin, polyisoprene resin, vinyl resin, epoxy resin, urethane resin, cellulose resin, siloxane resin, polyamide resin, and perylene resin. On the other hand, in the present specification "~~-based resin" is intended to include a functional group of "~~".

Each of the insulating layers, conductive layers, and semiconductor layers disposed on the base layer BS may be formed by coating or deposition. Then, through a plurality of photolithography processes, the insulating layer, the semiconductor layer, and the conductive layer may be selectively patterned to form holes in the insulating layer, or a semiconductor pattern, a conductive pattern, and a signal line may be formed.

The driving element layer DDL may include first to fifth insulating layers 10, 20, 30, 40, and 50 sequentially stacked on the base layer BS and a pixel driving unit PDC. FIG. 5 illustrates one transistor TR and two capacitors C1 and C2 of a pixel driving unit PDC. The transistor TR corresponds to the transistor connected to the light emitting element LD through the connection wiring CN, that is, a connection transistor connected to a node corresponding to the cathode of the light emitting element LD (the fourth node N4 in FIG. 2A or the second node N2 in FIG. 2B), and specifically, may correspond to the sixth transistor T6 of FIG. 2A or the first transistor T1 of FIG. 2B. Meanwhile, although not shown, other transistors constituting the pixel driving unit PDC may have the same structure as the transistor TR (hereinafter referred to as a connection transistor) shown in FIG. 5. However, this is described as an example, and other transistors constituting the pixel driving unit PDC may have structures different from those of the connection transistor TR, and are not limited to one embodiment.

The first insulating layer 10 may be disposed on the base layer BS. The first insulating layer 10 may be an inorganic layer and/or an organic layer, and may have a single layer or multilayer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 is shown as a single-layer silicon oxide layer. Meanwhile, insulating layers to be described later may be inorganic layers and/or organic layers, and may have a single-layer or multi-layer structure. The inorganic layer may include at least one of the above-mentioned materials, but is not limited thereto.

Meanwhile, the first insulating layer 10 may cover the lower conductive layer BCL. That is, the display panel may further include a lower conductive layer BCL disposed to overlap the connection transistor TR. The lower conductive layer BCL may block an electric potential due to a polarization phenomenon of the base layer BS from affecting the connection transistor TR. In addition, the lower conductive layer BCL may block light incident from the lower side to the connection transistor TR. At least one of an inorganic barrier layer and a buffer layer may be further disposed between the lower conductive layer BCL and the base layer BS.

The lower conductive layer BCL may include a reflective metal. For example, the lower conductive layer BCL may include titanium (Ti), molybdenum (Mo), an alloy containing Mo, aluminum (Al), an alloy containing Al, aluminum nitride (AlN), tungsten (W), tungsten nitride (WN), and copper (Cu).

In this embodiment, the lower conductive layer BCL may be connected to the source of the transistor TR through the source electrode pattern W1. In this case, the lower conductive layer BCL may be synchronized with the source of the transistor TR. However, this is illustrated as an example, and the lower conductive layer BCL may be connected to and synchronized with the gate of the transistor TR. Alternatively, the lower conductive layer BCL may be connected to another electrode to independently receive a constant voltage or pulse signal. Alternatively, the lower conductive layer BCL may be provided in an isolated form from other conductive patterns. The lower conductive layer BCL according to an embodiment of the inventive concept may be provided in various forms and is not limited to any one embodiment.

A connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. For example, the oxide semiconductor may include transparent conductive oxide (TCO), such as indium tin oxide (ITO), indium zinc oxide (IZO), indium gallium zinc oxide (IGZO), zinc oxide (ZnO) or indium oxide ($In_2O_3$). However, the embodiment of the inventive concept is not limited thereto, and the semiconductor pattern may include amorphous silicon, low-temperature polycrystalline silicon, or polycrystalline silicon.

The semiconductor pattern SP may include a source region SR, a drain region DR, and a channel region CR classified according to conductivity. The channel region CR may be a portion overlapping the gate electrode GE. The source region SR and the drain region DR may be spaced apart with a channel region CR therebetween. When the semiconductor pattern SP is an oxide semiconductor, each of the source region SR and the drain region DR may be a reduced region. Accordingly, the source region SR and the drain region DR have a relatively high reducing metal content compared to the channel region CR. Alternatively, when the semiconductor pattern SP is polycrystalline silicon, each of the source region SR and the drain region DR may be a region doped with a high concentration.

The source region SR and the drain region DR may have relatively higher conductivity than the channel region CR. The source region SR may correspond to the source electrode of the connection transistor TR, and the drain region DR may correspond to the drain electrode of the connection transistor TR. As shown in FIG. 5, separate source electrode patterns W1 and drain electrode patterns W2 respectively connected to the source region SR and the drain region DR may be further provided. Specifically, the separate source electrode pattern W1 and drain electrode pattern W2 may be integrally formed with one of the lines constituting the pixel driving unit PDC and PDC-1 (see FIGS. 2A and 2B), and are not limited to any one embodiment.

The second insulating layer 20 overlaps a plurality of pixels in common and may cover the semiconductor pattern SP. The second insulating layer 20 may be an inorganic layer and/or an organic layer, and may have a single layer or multilayer structure. The second insulating layer 20 may include at least one of aluminum oxide, titanium oxide, silicon oxide, silicon nitride, silicon oxynitride, zirconium oxide, and hafnium oxide. In this embodiment, the second insulating layer 20 may be a single-layer silicon oxide layer.

The gate electrode GE may be disposed on the second insulating layer 20. The gate electrode GE may correspond to the gate of the connection transistor TR. Also, the gate electrode GE may be disposed above the semiconductor pattern SP. However, this is illustrated as an example, and the gate electrode GE may be disposed below the semiconductor pattern SP, and is not limited to one embodiment.

The gate electrode GE may include titanium (Ti), silver (Ag), molybdenum (Mo), aluminum (Al), aluminum nitride (AlN), tungsten (W), tungsten nitride (WN), copper (Cu), or alloys thereof, but is not particularly limited thereto. A third insulating layer 30 may be disposed on the gate electrode GE.

The third insulating layer 30 may be an inorganic layer and/or an organic layer, and may have a single layer or multilayer structure. The fourth insulating layer 40 may include at least one of aluminum oxide, titanium oxide, silicon oxide, silicon nitride, silicon oxynitride, zirconium oxide, and hafnium oxide.

Among the plurality of conductive patterns W1, W2, CPE1, CPE2, and CPE3, the first capacitor electrode CPE1 and the second capacitor electrode CPE2 constitute the first capacitor C1. The first capacitor electrode CPE1 and the second capacitor electrode CPE2 may be spaced apart with the first insulating layer 10 and the second insulating layer 20 therebetween.

In one embodiment of the inventive concept, the first capacitor electrode CPE1 and the lower conductive layer BCL may have an integral shape. Also, the second capacitor electrode CPE2 and the gate electrode GE may have an integral shape.

A third capacitor electrode CPE3 may be disposed on the third insulating layer 30. The third capacitor electrode CPE3 is spaced apart from the second capacitor electrode CPE2 with the third insulating layer 30 therebetween and the third capacitor electrode CPE3 and the second capacitor electrode CPE2 may overlap each other. The third capacitor electrode CPE3 may constitute the second capacitor electrode CPE2 and the second capacitor C2.

A fourth insulating layer 40 may be disposed on the third insulating layer 30 and/or the third capacitor electrode CPE3. The fourth insulating layer 40 may be an inorganic layer and/or an organic layer, and may have a single layer or multilayer structure. The fourth insulating layer 40 may include at least one of aluminum oxide, titanium oxide, silicon oxide, silicon nitride, silicon oxynitride, zirconium oxide, and hafnium oxide.

A source electrode pattern W1 and a drain electrode pattern W2 may be disposed on the fourth insulating layer 40. The source electrode pattern W1 may be connected to the source region SR of the connection transistor TR through the first contact hole CNT1, and the source electrode pattern W1 and the source region SR of the semiconductor pattern SP may function as a source of the connection transistor TR. The drain electrode pattern W2 may be connected to the drain region DR of the connection transistor TR through the second contact hole CNT2, and the drain region DR of the drain electrode pattern W2 and the semiconductor pattern SP may function as a drain of the connection transistor TR. A fifth insulating layer 50 may be disposed on the source electrode pattern W1 and the drain electrode pattern W2.

The connection wiring CN may be disposed on the fifth insulating layer 50. The connection wiring CN may electrically connect the pixel driving unit PDC and the light emitting element LD. That is, the connection wiring CN may electrically connect the connection transistor TR and the light emitting element. The connection wiring CN may be a connection node connecting the pixel driving unit PDC and the light emitting element LD. That is, the connection wiring CN may correspond to the fourth node N4 (see FIG. 2A) shown in FIG. 2A or the second node N2 (see FIG. 2B) shown in FIG. 2B. On the other hand, this is illustratively described, if the connection wiring CN may be connected to the light emitting element LD, it may be defined as a connection node with various elements among elements constituting the pixel driving unit PDC according to the design of the pixel driving unit PDC, and is not limited to any one embodiment.

A sixth insulating layer 60 may be disposed on the connection wiring CN. The sixth insulating layer 60 may be disposed on the fifth insulating layer 50 to cover the connection wiring CN. Each of the fifth insulating layer 50 and the sixth insulating layer 60 may be an organic layer. For example, each of the fifth insulating layer 50 and the sixth insulating layer 60 may include Benzocyclobutene (BCB), polyimide, Hexamethyldisiloxane (HMDSO), Polymethylmethacrylate (PMMA), or general purpose polymers such as polystyrene (PS), polymer derivatives having phenolic groups, acrylic polymers, imide-based polymers, arylether-based polymers, amide-based polymers, fluorine-based polymers, p-xylene-based polymers, vinyl alcohol-based polymers, blends thereof, and the like.

An opening exposing at least a portion of the connection wiring CN may be provided in the sixth insulating layer 60. The connection wiring CN may be electrically connected to the light emitting element LD through a portion exposed from the sixth insulating layer 60. That is, the connection wiring CN may electrically connect the connection transistor TR and the light emitting element LD. A detailed description of this will be described later. Meanwhile, in the display panel DP according to an embodiment of the inventive concept, the sixth insulating layer 60 may be omitted or provided in plurality, and is not limited to one embodiment.

A light emitting element layer LDL may be disposed on the sixth insulating layer 60. The light emitting element layer LDL may include a pixel defining film PDL, a light emitting element LD, and a separator SPR. The pixel defining film PDL may be an organic layer. For example, the pixel defining film PDL may include Benzocyclobutene (BCB), polyimide, Hexamethyldisiloxane (HMDSO), Polymethylmethacrylate (PMMA), or general purpose polymers such as polystyrene (PS), polymer derivatives having phenolic groups, acrylic polymers, imide-based polymers, arylether-based polymers, amide-based polymers, fluorine-based polymers, p-xylene-based polymers, vinyl alcohol-based polymers, blends thereof, and the like.

In one embodiment, the pixel defining film PDL may have a property of absorbing light and may have, for example, a black color. That is, the pixel defining film PDL may include a black coloring agent. The black coloring agent may include a black dye and a black pigment. The black component may include a metal such as carbon black or chromium, or an oxide thereof. The pixel defining film PDL may correspond to a light blocking pattern having light blocking characteristics.

An opening OP-PDL (hereinafter referred to as an emission opening) exposing at least a portion of the first electrode EL1 to be described later may be defined in the pixel defining film PDL. The emission openings OP-PDL may be provided and disposed to correspond to light emitting elements, respectively. All components of the light emitting element LD may be overlapped and disposed in the emission opening OP-PDL, and may be a region in which light emitted by the light emitting element LD is substantially displayed. Accordingly, the shape of the light emitting unit EP (see FIG. 2) may substantially correspond to the shape of the emission opening OP-PDL.

The light emitting element LD may include a first electrode EL1, an intermediate layer IML, and a second electrode EL2. The first electrode EL1 may be a semi-transmissive, transmissive, or reflective electrode. According to one embodiment of the inventive concept, the first electrode EL1 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr)), or a compound thereof, and a transparent or semi-transparent electrode layer formed on the reflective layer. The transparent or semi-transparent electrode layer may include at least one or more selected from the group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode EL1 may include a stacked structure of ITO/Ag/ITO.

In this embodiment, the first electrode EL1 may be an anode of the light emitting element LD. That is, the first electrode EL1 may be connected to a first power supply line VDL (see FIG. 2A) and a first power supply voltage VDD (see FIG. 2A) may be applied. The first electrode EL1 may be connected to the first power supply line VDL in the display area DA (see FIG. 3A) or connected to the first power supply line VDL in the peripheral area NDA (see FIG. 3A). In the latter case, the first power supply line VDL may be disposed in the peripheral area NDA, and the first electrode EL1 may have a shape extending to the peripheral area NDA.

In the cross-sectional view of FIG. 5, the first electrode EL1 overlaps the emission opening OP-PDL and does not overlap the separator SPR, but as described above with reference to FIG. 4C, the first electrodes EL1 of each light emitting element may have an integral shape and may have a mesh or lattice shape in which openings are defined in some areas. That is, if the same first power supply voltage VDD may be applied to the first electrode EL1 of each of the plurality of light emitting elements, the shape of the first electrode EL1 may be provided in various ways, and is not limited to one embodiment.

The intermediate layer IML may be disposed between the first electrode EL1 and the second electrode EL2. The intermediate layer IML may include a light emitting layer EML and a functional layer FNL. The light emitting element LD may include an intermediate layer IML of various structures, and is not limited to any one embodiment. For example, the functional layer FNL may be provided as a plurality of layers or as two or more layers spaced apart with the light emitting layer EML therebetween. Alternatively, in one embodiment, the functional layer FNL may be omitted.

The light emitting layer EML may include an organic light emitting material. In addition, the light emitting layer EML may include an inorganic light emitting material or may be provided as a mixed layer of an organic light emitting material and an inorganic light emitting material. In this embodiment, the light emitting layers EML included in each adjacent light emitting unit EP may include light emitting materials displaying different colors. For example, the light emitting layer EML included in each light emitting unit EP may provide any one of blue, red, and green light. However, the embodiment of the inventive concept is not limited thereto, and the light emitting layers EML disposed on all light emitting units EP may include a light emitting material displaying the same color. In this case, the light emitting layer EML may provide blue light or white light. In addition, in FIG. 5, the light emitting layer EML and the functional layer FNL are illustrated as an embodiment in different shapes, but are not limited thereto and the light emitting layer EML and the functional layer FNL may be disposed in the same shape.

The functional layer FNL may be disposed between the first electrode EL1 and the second electrode EL2. Specifically, the functional layer FNL may be disposed between the first electrode EL1 and the light emitting layer EML or between the second electrode EL2 and the light emitting layer EML. Alternatively, both may be disposed between the first electrode EL1 and the light emitting layer EML and between the second electrode EL2 and the light emitting layer EML. In this embodiment, the light emitting layer EML is shown as being inserted into the functional layer FNL. However, this is shown as an example, and the functional layer FNL may include a layer disposed between the light emitting layer EML and the first electrode EL1 and/or a layer disposed between the light emitting layer EML and the second electrode EL2, and the functional layer FNL may be provided in plurality, and is not limited to any one embodiment.

The functional layer FNL may control the movement of charges between the first electrode and the second electrode. The functional layer FNL may include a hole injection/transport material and/or an electron injection/transport material. The functional layer FNL may include at least one of an electron blocking layer, a hole transporting layer, a hole injection layer, a hole blocking layer, an electron transporting layer, an electron injection layer, and a charge generating layer.

The second electrode EL2 may be disposed on the intermediate layer IML. As described above, the second electrode EL2 may be connected to the connection wiring CN and electrically connected to the pixel driving unit PDC. That is, the second electrode EL2 may be electrically connected to the connection transistor TR through the connection wiring CN.

As described above, the connection wiring CN may include a driving connection part CD and an emission connection part CE. The driving connection part CD may be a part of the connection wiring CN connected to the pixel driving unit PDC and substantially connected to the connection transistor TR. In this embodiment, the driving connection part CD may penetrate the fifth insulating layer 50 and may be electrically connected to the drain region DR of the semiconductor pattern SP through the drain electrode pattern W2. The emission connection part CE may be a part connected to a light emitting element LD of the connection wiring CN. The emission connection part CE may be defined in a region exposed from the sixth insulating layer 60 and may be a portion to which the second electrode EL2 is connected. At this time, a tip part TP may be defined in the emission connection part CE.

The emission connection part CE of the connection wiring CN will be described in more detail with reference to FIGS. 5 and 6A. As shown in FIGS. 5 and 6A, the connection wiring CN may have a three-layer structure. In detail, the connection wiring CN may include a first layer L1, a second layer L2, and a third layer L3 sequentially stacked along the third direction DR3. The second layer L2 may include a material different from that of the first layer L1. Also, the second layer L2 may include a material different from that of the third layer L3. The second layer L2 may be thicker than the first layer L1 or the third layer L3. The second layer L2 may include an electrically conductive material. In one embodiment, the second layer L2 may include aluminum (Al).

Meanwhile, the first layer L1 may include a material having a lower etch rate than the second layer L2. That is, the first layer L1 and the second layer L2 may be composed of materials having a high etching selectivity relative to each other. In one embodiment, the first layer L1 may include titanium (Ti), and the second layer L2 may include aluminum (Al). In this case, the side surface L1_W of the first layer L1 may be defined outside the side surface L2_W of the second layer L2. That is, the emission connection part CE of the connection wiring CN may have a shape in which the side surface L1_W of the first layer L1 protrudes outward from the side surface L2_W of the second layer L2. That is, the emission connection part CE of the connection wiring CN may have a shape in which the side surface L2_W of the second layer L2 is depressed inward from the side surface L1_W of the first layer L1.

Also, the third layer L3 may include a material having a lower etch rate than the second layer L2. That is, the third layer L3 and the second layer L2 may be composed of materials having a high etching selectivity to each other. In one embodiment, the third layer L3 may include titanium (Ti), and the second layer L2 may include aluminum (Al). In this case, the side surface L3_W of the third layer L3 may be defined outside the side surface L2_W of the second layer L2. That is, the emission connection part CE of the connection wiring CN may have a shape in which the side surface L3_W of the third layer L3 protrudes outward from the side surface L2_W of the second layer L2. That is, the emission connection part CE of the connection wiring CN may have an undercut shape or an overhang structure, and the tip part TP of the emission connection part CE may be defined by a protruding portion of the third layer L3 compared to the second layer L2.

The sixth insulating layer 60 and the pixel defining film PDL may expose at least a portion of the tip part TP and at least a portion of the second side surface L2_W. Specifically, a first opening OP1 exposing one side of the connection wiring CN is defined in the sixth insulating layer 60, and a second opening OP2 overlapping the first opening OP1 may be defined in the pixel defining film PDL. A planar area of the second opening OP2 may be larger than that of the first opening OP1. However, the inventive concept is not limited thereto, and if at least a portion of the tip part TP and at least a portion of the second side surface L2_W are exposed, the planar area of the second opening OP2 may be smaller than or equal to that of the first opening OP1.

An intermediate layer IML may be disposed on the pixel defining film PDL. The intermediate layer IML may also be disposed on a portion of the sixth insulating layer 60 exposed by the second opening OP2 of the pixel defining film PDL. Also, the intermediate layer IML may be disposed on a portion of the connection wiring CN exposed by the first opening OP1 of the sixth insulating layer 60. As shown in FIG. 6A, the intermediate layer IML may include one end portion IN1 disposed along the upper surface of the fifth insulating layer 50 and the other end portion IN2 disposed along the upper surface of the connection wiring tip part TP. That is, when viewed in cross section, the intermediate layer IML may have a shape in which the emission connection part CE is partially disconnected with respect to the tip part TP as a reference. However, in plan view, the intermediate layer IML may be continuously formed inside a region having a boundary defined by a separator SPR.

A second electrode EL2 may be disposed on the intermediate layer IML. The second electrode EL2 may also be disposed on a portion of the sixth insulating layer 60 exposed by the second opening OP2 of the pixel defining film PDL. Also, the second electrode EL2 may be disposed on a portion of the connection wiring CN exposed by the first opening OP1 of the sixth insulating layer 60. As shown in FIG. 6A, the second electrode EL2 may include one end portion EN1 of the second electrode EL2 disposed along the upper surface of the fifth insulating layer 50 and the other end portion EN2 disposed along the upper surface of the connection wiring tip part TP. That is, when viewed in cross section, the second electrode EL2 may have a shape in which the emission connection part CE is partially disconnected with respect to the tip part TP as a reference. However, when viewed in plan, the second electrode EL2 may have an integral shape connected as a whole within a region (see FIG. 4A) defined as a closed curve by the separator SPR.

Meanwhile, one end portion EN1 of the second electrode EL2 may be disposed along the side surface of the second layer L2 to contact the side surface L2 W of the second layer L2. Specifically, through the difference in the deposition angle of the second electrode EL2 and the intermediate layer IML, the second electrode EL2 may contact the side surface L2 W of the second layer L2 exposed from the intermediate layer IML by the tip part-portion TP. That is, the second electrode EL2 may be connected to the connection wiring CN without a separate patterning process for the intermediate layer IML, and accordingly, the light emitting element LD may be electrically connected to the pixel driving unit PDC through the connection wiring CN.

Also, in this embodiment, although the other end portion IN2 of the intermediate layer IML and the other end portion EN2 of the second electrode EL2 are shown as covering the side surface L3_W of the third layer L3, this is illustrated as an example, and at least a portion of the side surface L3_W of the third layer L3 may be exposed from the other end portion IN2 of the intermediate layer IML and/or the other end portion EN2 of the second electrode EL2.

Meanwhile, as described above, the display panel DP may include the separator SPR. The separator SPR may be disposed on the pixel defining film PDL. In one embodiment, the second electrode EL2 and the intermediate layer IML may be formed by depositing a plurality of pixels in common through an open mask. In this case, the second electrode EL2 and the intermediate layer IML may be divided by the separator SPR. As described above, the separator SPR may have a closed line shape for each light emitting unit, and thus the second electrode EL2 and the intermediate layer IML may have a divided shape for each light emitting unit. That is, the second electrode EL2 and the intermediate layer IML may be electrically independent (or electrically isolated) of adjacent pixels.

The separator SPR will be described in more detail with reference to FIGS. 5 and 6B. As shown in FIG. 6B, the separator SPR may have a reverse tapered shape. That is, an angle (taper angle below θ) formed by the side surface SPR_W of the separator SPR with respect to the upper surface of the pixel defining film PDL may be an obtuse angle. However, this is shown as an example, and if the separator SPR may electrically disconnect the second electrode EL2 for each pixel, the taper angle θ may be set in various ways. Also, the separator SPR may have the same structure as the tip part TP, and is not limited to one embodiment.

In one embodiment, the separator SPR may include an insulating material, and may include an organic insulating material in particular. The separator SPR may include an inorganic insulating material, may include a multi-layer structure of an organic insulating material and an inorganic insulating material, and may include a conductive material according to embodiments. That is, as long as the second electrode EL2 may be electrically disconnected for each pixel, the type of material of the separator SPR is not particularly limited.

A sensing electrode TE may be disposed above the separator SPR. Specifically, a dummy layer DML may be disposed on the separator SPR, a sensing electrode TE may be disposed on the dummy layer DML, and a detection insulating layer SIL may be disposed on the sensing electrode TE. The dummy layer DML is formed through the same process as the intermediate layer IML and the dummy layer DML and the intermediate layer IML may include the same material as each other. The sensing electrode TE may be formed through the same process as the second electrode EL2 and the sensing electrode TE and the second electrode EL2 may include the same material. That is, the dummy layer DML and the sensing electrode TE may be simultaneously formed in the process of forming the intermediate layer IML and the second electrode EL2.

The sensing electrode TE may be a part of the second electrode EL2 disconnected by the separator SPR. The separator SPR may have a closed line shape for each light emitting unit, and accordingly, the second electrode EL2 may have a divided shape for each light emitting unit. As the separator SPR has a constant width, the sensing electrode TE may be disposed on the separator SPR as a part of the disconnected second electrode EL2. That is, the sensing electrode TE and the second electrode EL2 may be electrically separated by the separator SPR, and the sensing electrode TE may perform a sensing function separately from the second electrode EL2. The display device DD according to an embodiment of the inventive concept does not form a separate sensor layer and performs a sensing function of a sensing electrode TE disposed on the separator SPR, so that a process may be simplified, and the thickness of the display device DD may be reduced.

As shown in FIG. 6B, in one embodiment, the second electrode EL2 may include a first end portion EN1a, and the sensing electrode TE may include a second end portion EN2a. The first end portion EN1a may be spaced apart from the separator SPR and positioned on a pixel defining film PDL, and the second end portion EN2a may be separated from the first end portion EN1a and positioned on the side surface SPR_W of the separator SPR. However, although the first end portion EN1a is shown to be spaced apart from the side surface SPR_W of the separator SPR by a predetermined distance in FIG. 6B, the inventive concept is not limited thereto, and if the second end portion EN2a is electrically disconnected, the first end portion EN1a may also contact the side surface SPR_W of the separator SPR. In addition, even if the first end portion EN1a and the second end portion EN2a are connected without being distinguished from each other, when the thickness of the portion formed along the side surface SPR_W of the separator SPR is thin and the electrical resistance is high, if the second electrode EL2 is electrically disconnected between adjacent pixels, it may be considered that the second electrode EL2 is divided by the separator SPR.

According to the inventive concept, even if there is no separate patterning process for the second electrode EL2 or the intermediate layer IML, by not forming the second electrode EL2 or the intermediate layer IML on the side surface SPR_W of the separator SPR or by forming it thinly, the second electrode EL2 or the intermediate layer IML may be divided for each pixel. In addition, if the second electrode EL2 or the intermediate layer IML may be electrically disconnected between adjacent pixels, the shape of the separator SPR may be variously modified without being limited to the embodiment that is explicitly disclosed herein.

Referring back to FIG. 5, an encapsulation layer ECL may be disposed on the light emitting element layer LDL. The encapsulation layer ECL may cover the light emitting element LD and may cover the separator SPR. The encapsulation layer ECL may include a first inorganic layer IL1, an organic layer OL, and a second inorganic layer IL2 sequentially stacked. However, the embodiment of the inventive concept is not limited thereto, and the encapsulation layer ECL may further include a plurality of inorganic layers and organic layers. Also, the encapsulation layer ECL may be a glass substrate.

The first and second inorganic layers IL1 and IL2 may protect the light emitting element LD from moisture and oxygen outside the display panel DP, and the organic layer OL may protect the light emitting element LD from foreign substances such as particles remaining during the formation of the first inorganic layer IL1. The first and second inorganic layers IL1 and IL2 may include a silicon nitride layer, a silicon oxynitride layer, a silicon oxide layer, a titanium oxide layer, an aluminum oxide layer, or the like. The organic layer OL may include an acryl-based organic layer, but this is not a limitation.

A light control layer RSL may be disposed on the encapsulation layer ECL. Specifically, the light control layer RSL may be disposed on the display panel DP. The light control layer RSL may be an antireflection layer that reduces reflectance of external light incident from the outside. The light control layer RSL may be a layer that selectively transmits light emitted from the display panel DP. The light control layer RSL may not include a polarization layer. Accordingly, light passing through the light control layer RSL and incident on the display panel DP may be unpolarized light. However, the embodiment of the present invention is not limited thereto, and the light control layer RSL includes a polarization layer, so that light passing through the light control layer RSL and incident on the display panel DP may be polarized light.

Figure 7:
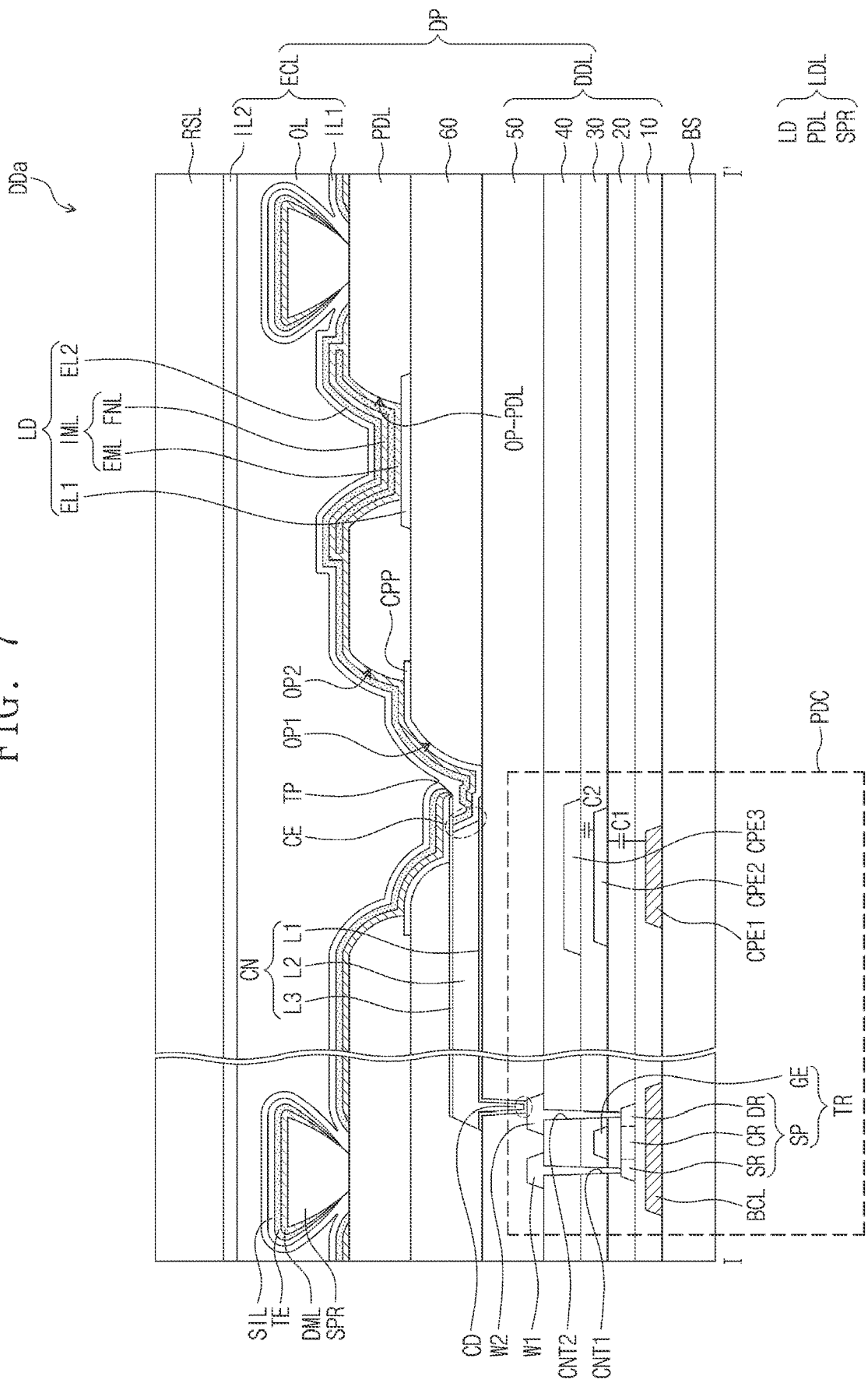
FIG. 7 is a cross-sectional view of a display device according to an embodiment of the inventive concept.

FIG. 7 is a cross-sectional view of a display panel according to an embodiment of the inventive concept. For easy description, FIG. 7 is a cross-sectional view of a region corresponding to FIG. 5. Below, the same reference numerals are assigned to the same configurations as those described in FIGS. 1 to 6B, and duplicate descriptions will be omitted.

Compared to the display device DD shown in FIG. 5, the display device DDa shown in FIG. 7 may further include a capping pattern CPP. The capping pattern CPP may be disposed on the sixth insulating layer 60. Also, the capping pattern CPP may be disposed on a portion of the connection wiring CN exposed by the first opening OP1 of the sixth insulating layer 60. The capping pattern CPP may overlap with the connection wiring CN, and may specifically overlap with the emission connection part CE and/or the tip part TP.

In addition, when viewed in cross section as shown in FIG. 7, the capping pattern CPP may have a shape in which the connection is partially disconnected based on the tip part TP in a region where the emission connection part CE is defined. However, in plan view, the capping pattern CPP may be continuously formed inside a region whose boundary is defined by a separator SPR. Meanwhile, one end portion of the partially disconnected capping pattern CPP may contact the side surface of the connection wiring second layer L2, and another end portion of the capping pattern CPP may be disposed on the third connection wiring layer L3 to cover the tip part TP.

The capping pattern CPP may include a conductive material. Accordingly, the second electrode EL2 may be electrically connected to the connection wiring CN through the capping pattern CPP. That is, the capping pattern CPP contacts the side surface of the connection wiring second layer L2 and then the second electrode EL2 contacts the capping pattern CPP to electrically connect all of them. The capping pattern CPP may be disposed relatively outside the connection wiring second layer L2, and the second electrode EL2 may be electrically connected to the second layer L2 only by being connected to the capping pattern CPP instead of the side surface of the second layer L2, so that a connection between the connection wiring CN and the second electrode E2 may be easily made.

Also, the capping pattern CPP may include a material having a relatively low reactivity compared to the connection wiring second layer L2. For example, the capping pattern CPP may include copper (Cu), silver (Ag), a transparent conductive oxide, or the like. As the side surface of the connection wiring second layer L2 is protected by the capping pattern CPP having relatively low reactivity, oxidation of a material included in the second layer L2 may be prevented. In addition, during the etching process of patterning the first electrode EL1, the silver (Ag) component included in the first electrode EL1 layer is reduced and remaining as particles causing defects may be prevented.

In one embodiment, the capping pattern CPP is formed through the same process as the first electrode EL1 and may include the same material as the first electrode EL1. However, this is just one example, and the capping pattern CPP may be formed through a process different from that of the first electrode EL1 or may include a different material.

Figure 8:
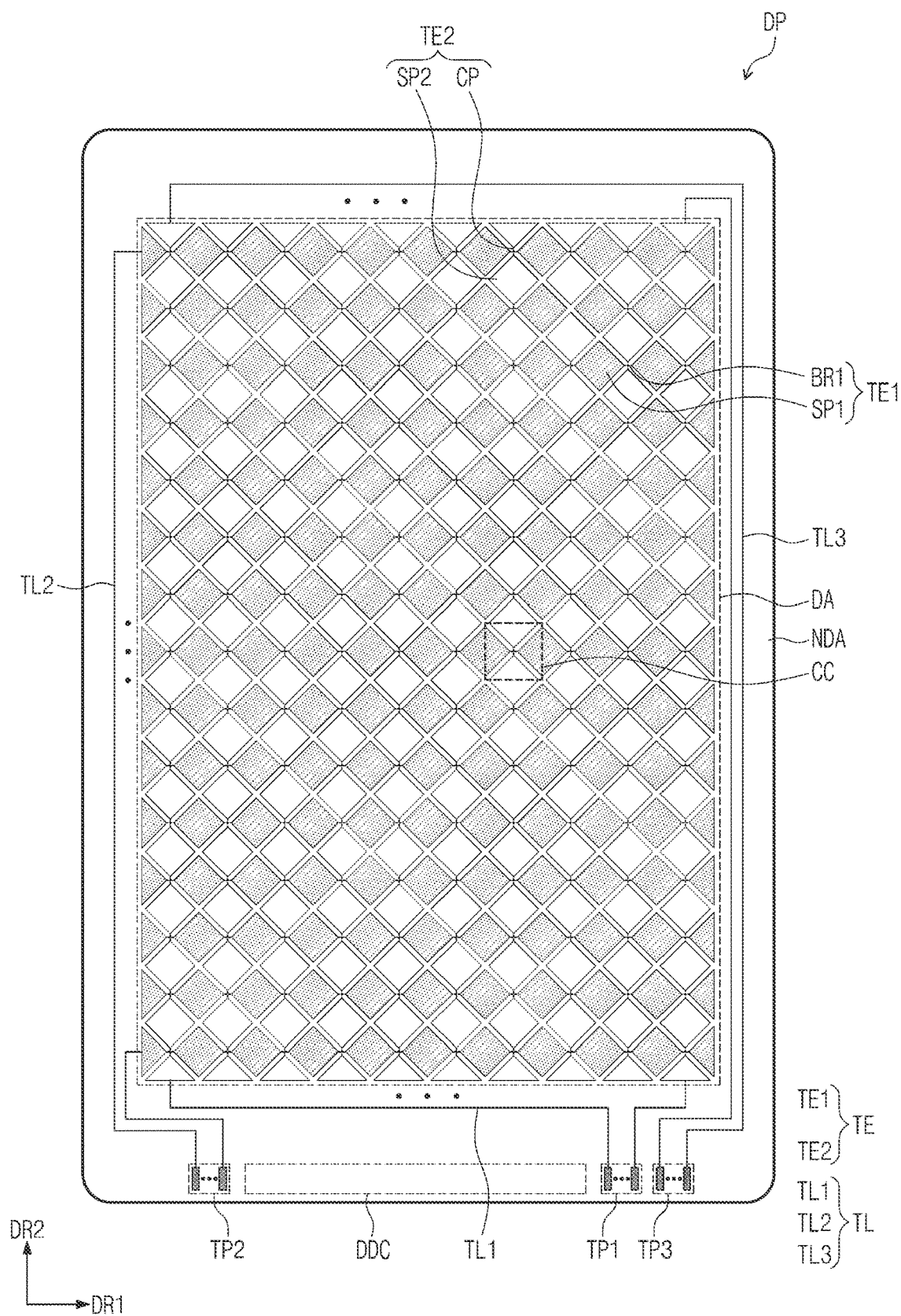
FIG. 8 is a plan view of a display panel according to an embodiment of the inventive concept.

FIG. 8 is a plan view of a display panel according to an embodiment of the inventive concept.

Referring to FIG. 8, the display panel DP may provide a rectangular display area DA. The non-display area NDA is illustrated as a rectangular frame shape enclosing the display area DA. The display panel DP may include a plurality of sensing electrodes TE arranged in a display area DA, a plurality of signal lines TL1, TL2, and TL3 arranged in a non-display area NDA, and a plurality of pads TP1, TP2, and TP3. A plurality of sensing electrodes TE are disposed in the display area DA to sense external input.

The sensing electrodes TE may include a plurality of first sensing electrodes TE1 arranged along the second direction DR2 and a plurality of second sensing electrodes TE2 arranged along the first direction DR1. The display device DD may be driven by a mutual capacitance method in which the first sensing electrodes TE1 and the second sensing electrodes TE2 receive different electrical signals, or may be driven by a self-capacitance method in which the first sensing electrodes TE1 and the second sensing electrodes TE2 receive the same electrical signal. Alternatively, the display device DD may be driven in a resistive manner that senses an external input through a resistance change of each of the first sensing electrodes TE1 and the second sensing electrodes TE2. The display panel DP according to an embodiment of the inventive concept may be driven in various ways if it may sense an external input through the first sensing electrodes TE1 and the second sensing electrodes TE2, and the embodiment of the inventive concept is not limited thereto.

Each of the plurality of first sensing electrodes TE1 may include a plurality of first sensing patterns SP1 arranged along the first direction DR1 and a plurality of first bridge patterns BR1 alternately arranged in the first sensing patterns SP1. Each of the first bridge patterns BR1 electrically connects two adjacent first sensing patterns SP1 in the first direction DR1.

The second sensing electrodes TE2 are electrically insulated from the first sensing electrodes TE1. Accordingly, the second sensing electrodes TE2 may be independently driven from the first sensing electrodes TE1. Each of the second sensing electrodes TE2 may include a plurality of second sensing patterns SP2 arranged along the second direction DR2 and a plurality of connection patterns CP alternately arranged with the second sensing patterns SP2. Each of the connection patterns CP electrically connects two adjacent second sensing patterns SP2 in the second direction DR2.

The first bridge patterns BR1 may be disposed on a different layer from the first sensing electrode TE1 and the second sensing electrode TE2. The first bridge patterns BR1 may be composed of mesh lines or a transparent pattern. The first bridge patterns BR1 may be disposed on another layer and connected to the first sensing electrode TE1 and the second sensing electrode TE2 through predetermined contact holes. A detailed description of this will be described later.

The signal lines TL are disposed in the non-display area NDA to electrically connect the circuit board and the sensing electrodes TE. On the other hand, this is shown as an example, in the display device DD according to an embodiment of the inventive concept, a driving circuit for driving the sensing electrodes TE may be disposed on the panel, and in this case, the circuit board may be omitted.

The non-display area NDA is adjacent to the display area DA. The non-display area NDA may be an area in which signal lines for providing a signal applied from the outside to the display area DA or driving elements for driving the display area DA are disposed.

The non-display area NDA is shown as a shape surrounding the display area DA. However, this is shown as an example, and the non-display area NDA may be omitted in the display panel DP according to an embodiment of the inventive concept. Alternatively, the non-display area NDA may be adjacent to one side of the display area DA. The non-display area NDA may have various shapes and is not limited to one embodiment.

The signal lines TL may include first to third lines TL1, TL2, and TL3. Specifically, the first and third lines TL1 and TL3 may be connected to the first sensing electrodes TE1, and the second lines TL2 may be connected to the second sensing electrodes TE2. As transferring an electrical signal to the first sensing electrodes TE1 having a relatively long length through two lines TL1 and TL3, a uniform touch sensitivity may be provided over the entire display area DA by mitigating the response speed difference with the second sensing electrodes TE2. However, this is shown as an example, and the display panel DP may have sensing electrodes of various structures without being limited to the embodiment that is explicitly disclosed.

Figure 9:
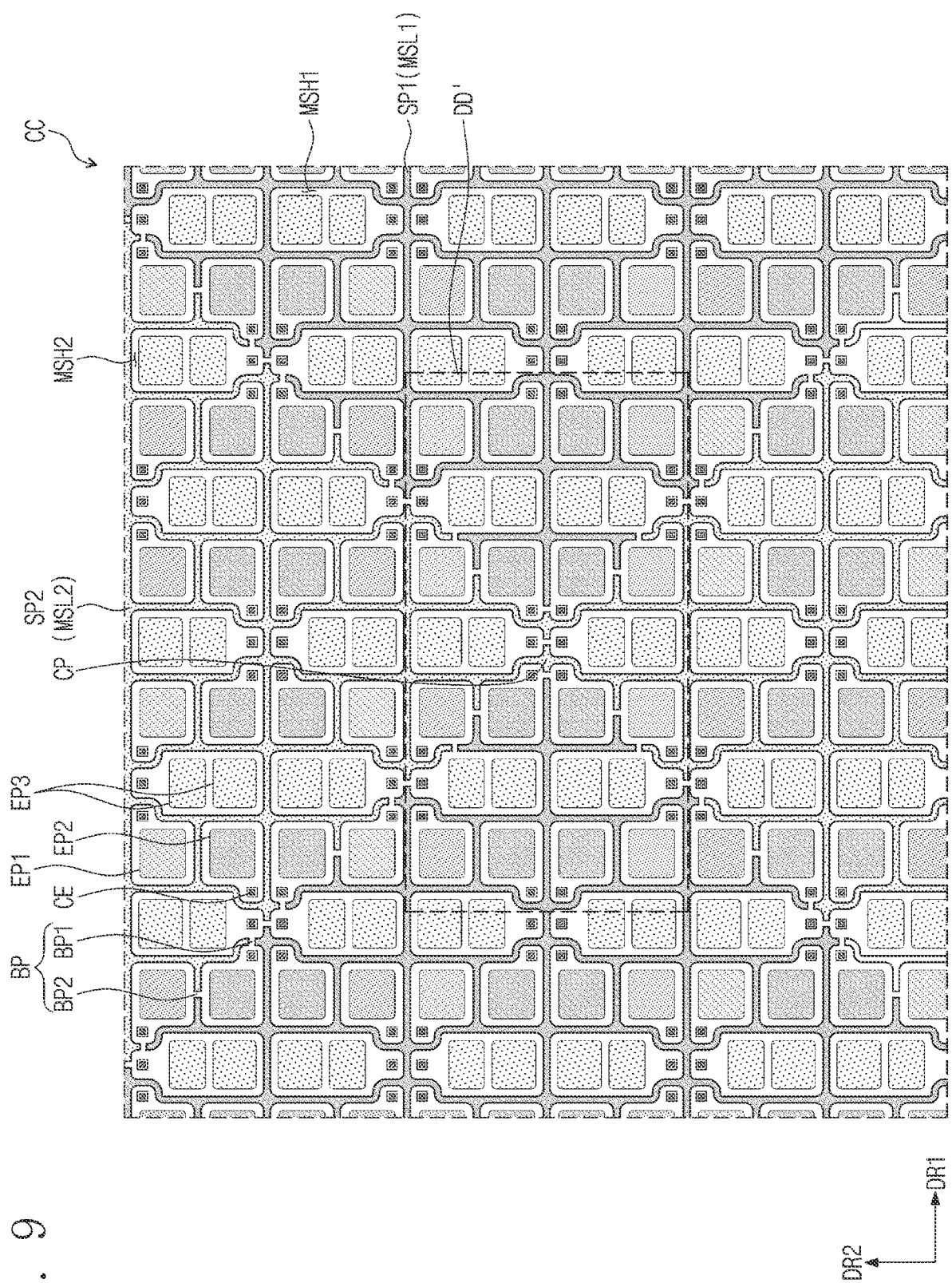
FIG. 9 is an enlarged view of the CC region shown in FIG. 8.
Figure 10:
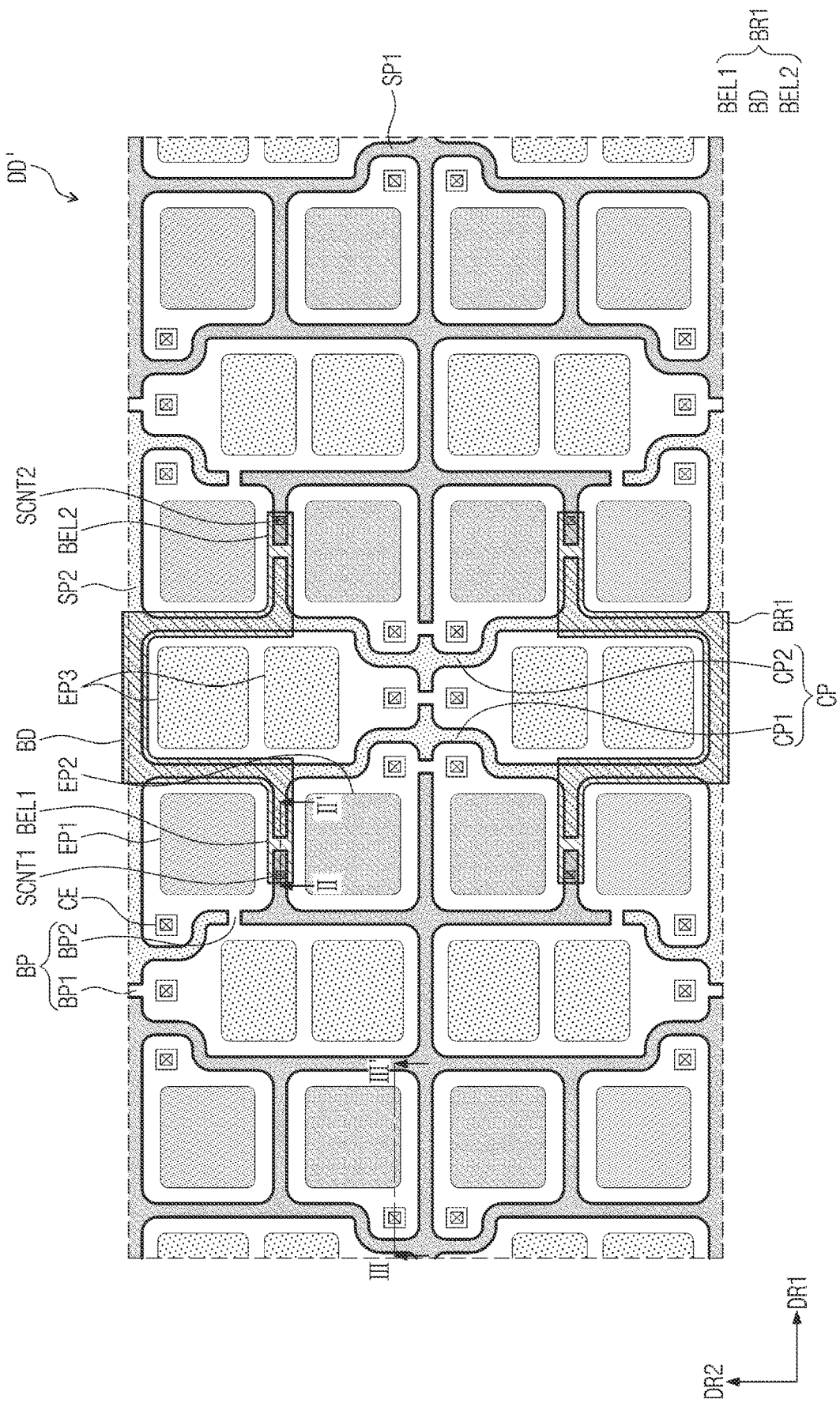
FIG. 10 is an enlarged view of the area DD' shown in FIG. 9.

FIG. 9 is an enlarged view of area CC shown in FIG. 8. Specifically, it is a plan view in which a partial area of the display device according to an embodiment of the inventive concept is enlarged. FIG. 10 is an enlarged view of area DD' shown in FIG. 9. In FIG. 10, some of the components shown in FIG. 9 are omitted or emphasized. Hereinafter, the inventive concept will be described with reference to FIGS. 9 and 10.

FIG. 9 illustrates a first sensing pattern SP1 included in the first sensing electrode TE1 (see FIG. 8) and a second sensing pattern SP2 included in the second sensing electrode TE2 (see FIG. 8). As shown in the drawing, each of the first sensing patterns SP1 and the second sensing patterns SP2 may include mesh lines. Specifically, each of the first sensing patterns SP1 may include a first mesh line MSL1, and each of the second sensing patterns SP2 may include a second mesh line MSL2. According to one embodiment of the inventive concept, a plurality of first mesh holes MSH1 may be defined by each of the first mesh line MSL1 and a plurality of second mesh holes MSH2 may be defined by each of the second mesh line MSL2. The first mesh holes MSH1 and the second mesh holes MSH2 may correspond to one of the plurality of light emitting units EP1, EP2, and EP3 (or light emitting areas). Accordingly, the first mesh line MSL1 and the second mesh line MSL2 may have a shape surrounding edges of the light emitting units EP1, EP2, and EP3. As each of the first sensing pattern SP1 and the second sensing pattern SP2 according to an embodiment of the inventive concept is designed not to cover the light emitting units EP1, EP2, and EP3, deterioration of the display characteristics of the display device DD may be prevented.

The connection patterns CP may be disposed between two adjacent second sensing patterns SP2 to electrically connect the two second sensing patterns SP2. The connection patterns CP may be alternately disposed with the second sensing patterns SP2 in the second direction DR2 and integrally formed with two adjacent second sensing patterns SP2. The connection patterns CP may be formed adjacent to the plurality of first connection parts CE. As shown, the plurality of first connection parts CE are arranged in groups of six, and the connection patterns CP may be formed between the plurality of first connection parts CE consisting of six groups.

Boundary portions BP may be defined between the first sensing electrode TE1 and the second sensing electrode TE2. Specifically, the boundary portions BP may be regions where one of a plurality of first sensing patterns SP1 included in the first sensing electrode TE1 and one adjacent to the first sensing patterns SP1 among the plurality of second sensing patterns SP2 included in the second sensing electrode TE2 are separated from each other. The first sensing electrode TE1 and the second sensing electrode TE2 may be spaced apart from each other by the boundary portions BP and electrically insulated from each other. According to an embodiment of the inventive concept, some of the boundary portions BP may be formed between a plurality of first connection parts CE. The boundary portions BP may include a first boundary portion BP1 formed between the first connection parts CE and a second boundary portion BP2 formed spaced apart from the first connection parts CE. The number of first boundary portions BP1 may be greater than the number of second boundary portions BP2. As the number of first boundary portions BP1 formed between the first connection parts CE is greater than the number of second boundary portions BP2 formed apart from the first connection parts CE, noise generated by a variable voltage generated around the first connection parts CE may be reduced. As a result, a reliable display device DD (see FIG. 1) with improved sensing performance may be provided.

Referring to FIG. 10, a first bridge pattern BR1 may be formed between adjacent first sensing patterns SP1. Specifically, the first bridge pattern BR1 may electrically connect two adjacent first sensing patterns SP1 among the plurality of first sensing patterns SP1 in the first direction DR1. Two adjacent first sensing patterns SP1 may be connected by two first bridge patterns BR1 in the first direction DR1. Two first bridge patterns BR1 connecting two adjacent first sensing patterns SP1 may be spaced apart from each other in the second direction DR2. As shown, two first bridge patterns BR1 connecting two adjacent first sensing patterns SP1 are provided, but the inventive concept is not limited thereto.

According to an embodiment of the inventive concept, the first bridge pattern BR1 may be disposed on a different layer from the first sensing patterns SP1. The first bridge pattern BR1 may be disposed on a different layer from the first sensing patterns SP1 and the second sensing patterns SP2, and may partially overlap the second sensing patterns SP2. The first bridge pattern BR1 may be disposed to overlap the second sensing patterns SP2 on a different layer, and electrically connect the two adjacent first sensing patterns SP1.

The first bridge pattern BR1 may include a first bridge end portion BEL1 and a second bridge end portion BEL2 connected to two adjacent first sensing patterns SP1, respectively, and a bridge bending portion BD connecting the first bridge end portion BEL1 and the second bridge end portion BEL2. The first bridge end portion BEL1 may be connected to the first sensing pattern SP1 in the opposite direction to the first direction DR1 among the two adjacent first sensing patterns SP1 through the first sensing contact hole SCNT1, and the second bridge end portion BEL2 may be connected to the remaining first sensing pattern SP1 among two adjacent first sensing patterns SP1 through the second sensing contact hole SCNT2. Accordingly, the first bridge end portion BEL1 and the second bridge end portion BEL2 may be spaced apart from each other in the first direction DR1. The bridge bending portion BD may correspond to a body portion connecting the first bridge end portion BEL1 and the second bridge end portion BEL2. The bridge bending portion BD may overlap a part of the second sensing patterns SP2.

According to an embodiment of the inventive concept, at least one light emitting unit among the plurality of light emitting units EP1, EP2, and EP3 may be arranged between the first bridge end portion BEL1 and the second bridge end portion BEL2. According to the illustration, the third light emitting unit EP3 may be disposed between the first bridge end portion BEL1 and the second bridge end portion BEL2. As the third light emitting unit EP3 is placed between the first bridge end portion BEL1 and the second bridge end portion BEL2, the first bridge pattern BR1 may have a form of surrounding the third light emitting unit EP3. However, the embodiment of the inventive concept is not limited thereto, and the first bridge pattern BR1 may have various shapes according to the position of the first bridge end portion BEL1 and the second bridge end portion BEL2.

The first bridge pattern BRI may not overlap the first boundary portion BP1 in plan view, and may overlap the second boundary portion BP2. The second boundary portion BP2 may be spaced apart from the third light emitting unit EP3. According to an embodiment of the inventive concept, the first bridge pattern BRI may be spaced apart from the plurality of first connection parts CE without crossing the plurality of first connection parts CE. Specifically, the bridge bending portion BD of the first bridge pattern BRI extends from the first bridge end portion BEL 1 and the second bridge end portion BEL2, and does not intersect the plurality of first connection parts CE. As an example of the inventive concept, the bridge bending portion BD may have a shape bent in a direction distant from a plurality of first connection parts CE. As the first bridge pattern BR1 is spaced apart from the plurality of first connection parts CE, when sensing, the noise generated by the variable voltage generated around the first connection parts CE may be reduced. As a result, a reliable display device DD with improved sensing performance may be provided.

The connection patterns CP may include a first connection pattern CP1 and a second connection pattern CP2. The first connection pattern CP1 and the second connection pattern CP2 may electrically connect two adjacent second sensing patterns SP2 in the second direction DR2. The first connection pattern CP1 and the second connection pattern CP2 may be spaced apart from each other in the first direction DR1. The connecting pattern CP is not limited to including the first connection patterns CP1 and the second connection pattern CP2 connecting two adjacent second sensing patterns SP2 as shown in the drawing, and may include two or more connection patterns.

Figure 11:
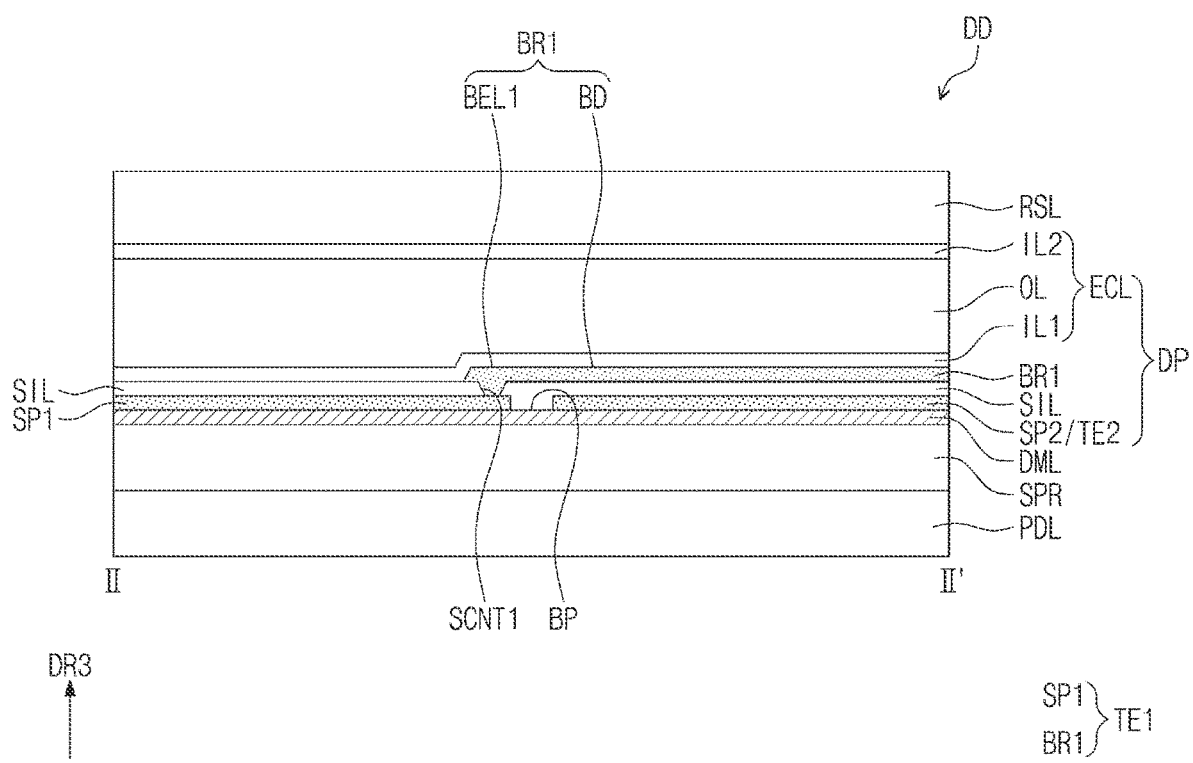
FIG. 11 is a cross-sectional view of the display device showing a portion corresponding to line II-II' of FIG. 10.

FIG. 11 is a cross-sectional view of the display device showing a portion corresponding to line II-II' of FIG. 10. Hereinafter, redundant description of the display panel DP will be omitted.

Referring to FIG. 11, a first bridge pattern BR1 may be disposed on a detection insulating layer SIL, and may be connected to the first sensing patterns SP1 through the first sensing contact hole SCNT1 formed in the detection insulating layer SIL. A dummy layer DML may be disposed on the separator SPR, and a first sensing pattern SP1 of a first sensing electrode TE1 and a second sensing pattern SP2 of a second sensing electrode TE2 may be disposed on the dummy layer DML. In one embodiment, the dummy layer DML may be omitted.

According to an embodiment of the inventive concept, the first sensing electrode TE1 and the second sensing electrode TE2 may be disposed on the same layer. The first sensing pattern SP1 of the first sensing electrode TEL and the second sensing pattern SP2 of the second sensing electrode TE2 may be disposed on the same layer. As shown in the drawing, the first sensing pattern SP1 and the second sensing pattern SP2 are disposed on the dummy layer DML, but the first sensing pattern SP1 and the second sensing pattern SP2 may be directly disposed on the separator SPR by omitting the dummy layer DML in some embodiments. The first sensing electrode TE1 and the second sensing electrode TE2 are insulated from each other, and a boundary portion BP in which the first sensing electrode TEL and the second sensing electrode TE2 are insulated may be defined on the separator SPR. The boundary portion BP is a part where the first sensing pattern SP1 and the second sensing pattern SP2 are not arranged, and by patterning the part where the first sensing electrode TE1 and the second sensing electrode TE2 are integrally connected, or by applying a planar anti-deposition material to the boundary portion BP, the first sensing electrode TE1 and the second sensing electrode TE2 may be formed.

A detection insulating layer SIL may be disposed on the first sensing pattern SP1 and the second sensing pattern SP2 to cover the first sensing pattern SP1 and the second sensing pattern SP2. The detection insulating layer SIL may have a single-layer structure or a multi-layer structure stacked along the third direction DR3. The detection insulating layer SIL may include silicon nitride, silicon oxide, or a combination thereof. A detection insulating layer SIL may be formed through a deposition process.

The first bridge pattern BR1 may be disposed on the detection insulating layer SIL. The first bridge pattern BR1 may be disposed on the detection insulating layer SIL to face the second sensing pattern SP2. The first bridge pattern BR1 may be connected to the first sensing pattern SP1 through the first and second sensing contact holes SCNT1 and SCNT2 formed by penetrating the detection insulating layer SIL in at least a region adjacent to the boundary portion BP. Specifically, the first bridge end portion BEL1 of the first bridge pattern BR1 may be connected to the first sensing pattern SP1 disposed adjacent to the boundary portion BP through the first sensing contact hole SCNT1 formed through the detection insulating layer SIL. As the first bridge pattern BR1 is disposed on a different layer from the first sensing pattern SP1, even if a layer in which the first sensing pattern SP1 and the second sensing pattern SP2 are disposed is disconnected in a certain area, a signal may be easily transmitted.

An encapsulation layer ECL may be disposed on the first bridge pattern BR1 and the detection insulating layer SIL. The encapsulation layer ECL may include a first inorganic layer IL1, an organic layer OL, and a second inorganic layer IL2 sequentially stacked. The encapsulation layer ECL may have the same configuration as the encapsulation layer ECL shown in FIG. 5.

Figure 12:
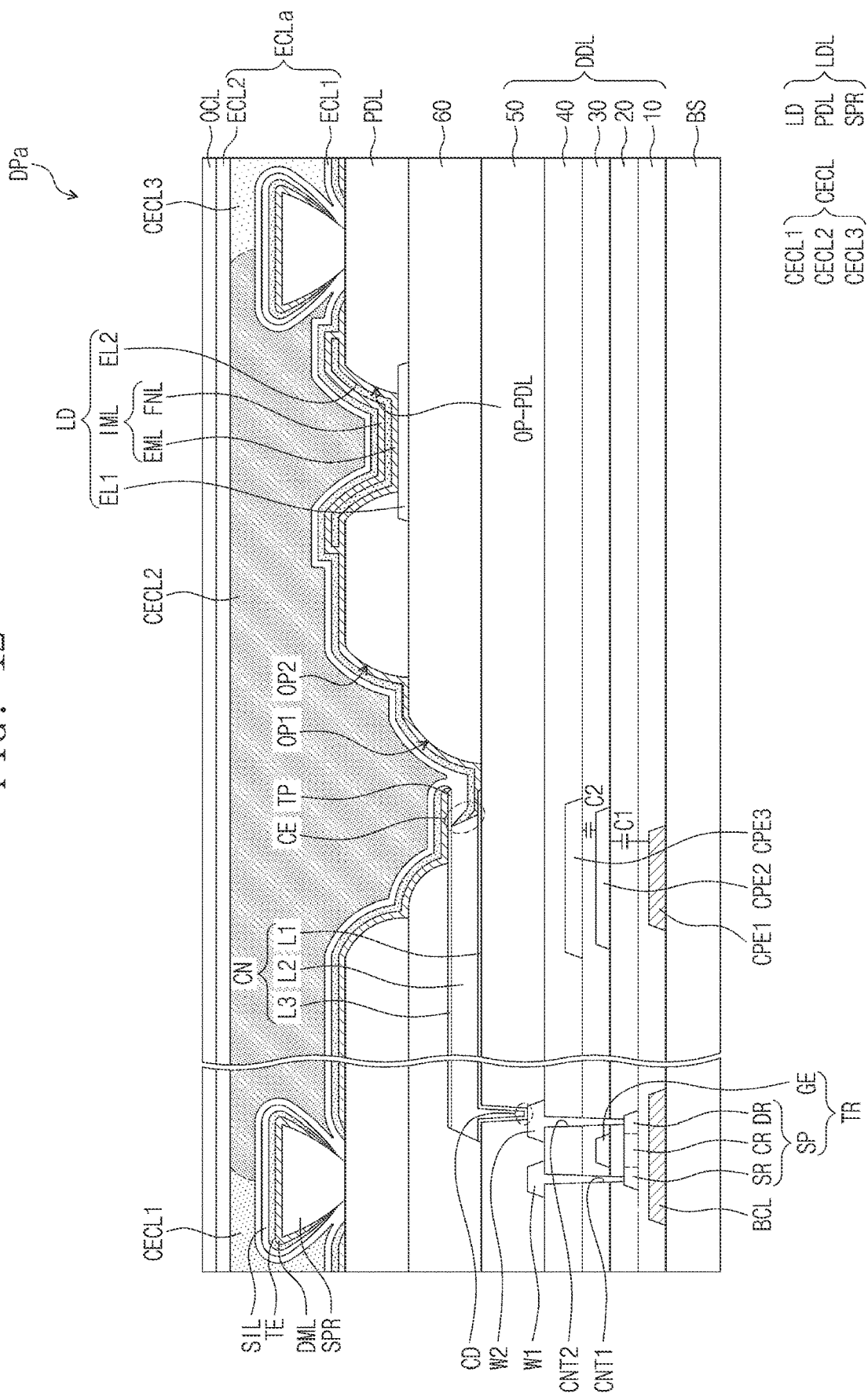
FIG. 12 is a cross-sectional view of a display device according to an embodiment.

FIG. 12 is a cross-sectional view of a display panel according to an embodiment of the inventive concept.

Referring to FIG. 12, a display panel DPa according to an embodiment of the inventive concept may include an encapsulation layer ECLa disposed on the second electrode EL2 and the sensing electrode TE and an overcoating layer OCL included on the encapsulation layer ECLa. The encapsulation layer ECLa may include a first encapsulation layer ECL1, a color encapsulation layer CECL disposed on the first encapsulation layer ECL1, and a second encapsulation layer ECL2 disposed on the color encapsulation layer CECL. The first encapsulation layer ECL1 and the second encapsulation layer ECL2 may be inorganic layers IL2. The first encapsulation layer ECL1 may be disposed on the second electrode EL2 and the sensing electrode TE. Specifically, the first encapsulation layer ECL1 may be disposed on the second electrode EL2 and the detection insulating layer SIL. The first encapsulation layer ECL1 and the second encapsulation layer ECL2 are inorganic layers, and may protect the light emitting element LD from moisture and oxygen outside the display panel DPa.

The color encapsulation layer CECL may include color filters. The color filters may have a predetermined arrangement. For example, color filters may be arranged in consideration of emission colors of pixels included in the display panel DPa. According to one embodiment of the inventive concept, the color encapsulation layer CECL may include a first color encapsulation layer CECL1, a second color encapsulation layer CECL2, and a third color encapsulation layer CECL3 according to included color filters.

The first color encapsulation layer CECL1, the second color encapsulation layer CECL2, and the third color encapsulation layer CECL3 may transmit light of different color lights. The first color encapsulation layer CECL1 may transmit light of any one color among red light, green light, and blue light, and the second color encapsulation layer CECL2 and the third color encapsulation layer CECL3 may respectively transmit light of other colors. The colors of light transmitted through the first color encapsulation layer CECL1, the second color encapsulation layer CECL2, and the third color encapsulation layer CECL3 are not particularly limited thereto.

The light emitting element LD may include a first light emitting element LD1 (see FIG. 4A), a second light emitting element LD2 (see FIG. 4A), and a third light emitting element LD3 (see FIG. 4A) emitting different color lights. For example, the first light emitting element LD1 may emit red light, the second light emitting element LD2 may emit green light, and the third light emitting element LD3 may emit blue light, but the combination of colors is not limited thereto. Referring to FIG. 12, representatively, a light emitting element LD is shown, and the light emitting element LD may be applied in the same manner as the description of the first light emitting element LD1, the second light emitting element LD2, and the third light emitting element LD3.

The first color encapsulation layer CECL1 may overlap the first light emitting element LD1 emitting red light. The second color encapsulation layer CECL2 may overlap the second light emitting element LD2 emitting green light. The third color encapsulation layer CECL3 may overlap the third light emitting element LD3 emitting blue light. The first color encapsulation layer CECL1, the second color encapsulation layer CECL2, and the third color encapsulation layer CECL3 may be divided based on the separator SPR. That is, the light emitting elements are separated based on the separator SPR, and two color encapsulation layers of the first color encapsulation layer CECL1, the second color encapsulation layer CECL2, and the third color encapsulation layer CECL3 overlap on the separator SPR.

An overcoating layer OCL may be disposed on the encapsulation layer ECLa. Specifically, the overcoating layer OCL may be disposed on the second encapsulation layer ECL2. The overcoating layer OCL may include an organic material, and a flat surface may be provided on an upper surface of the overcoating layer OCL. In one embodiment, the over coating layer OCL may be omitted.

Since the color encapsulation layer CECL includes color filters and serves as a color filter, the display device may not include a separate color filter layer. Accordingly, the overall thickness of the display device may be reduced and the manufacturing process may be simplified.

Figure 13:
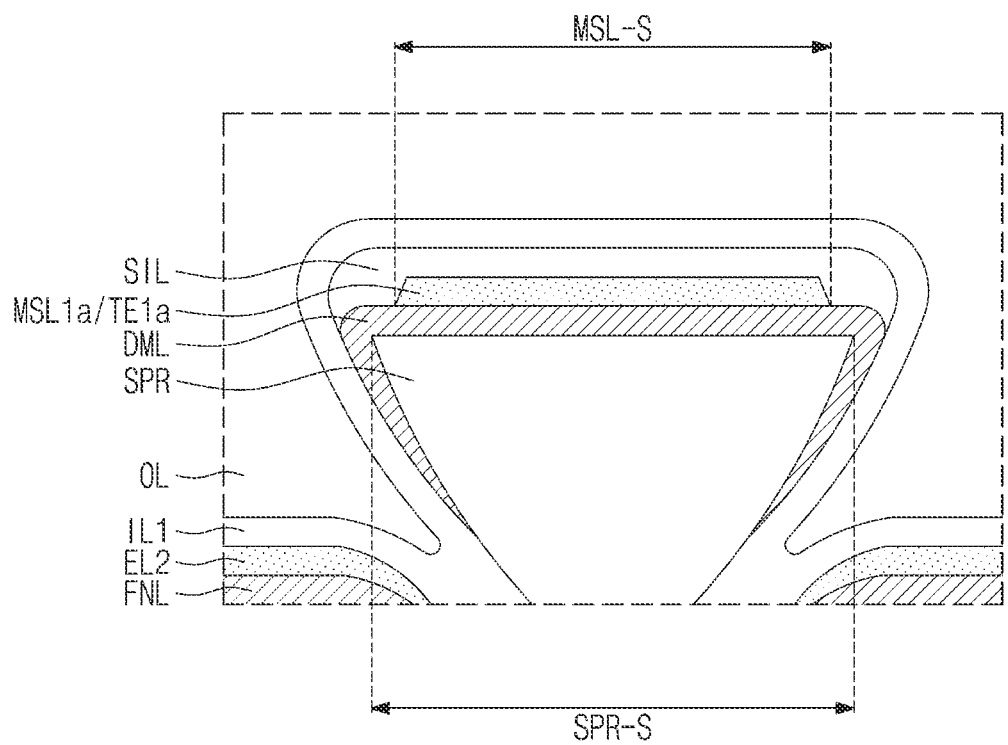
FIG. 13 is a cross-sectional view illustrating a portion of a display device according to an embodiment.

FIG. 13 is a cross-sectional view illustrating a portion of a display device according to an embodiment.

Referring to FIG. 13, the first sensing electrode TE1a may not overlap the second electrode EL2. Specifically, the first sensing electrode TE1a may overlap the separator SPR. The first sensing electrode TE1a may be disposed on the upper surface of the separator SPR and spaced apart from the second electrode EL2. As an example of the inventive concept, the first sensing electrode TE1a may not overlap a second electrode EL2 overlapping a plurality of light emitting units EP1, EP2, and EP3 (see FIG. 10). Although not shown, the second sensing electrode may also overlap the separator SPR and not overlap the second electrode EL2, similarly to the first sensing electrode TE1a.

The first mesh line MSL1a included in the first sensing electrode TE1a may overlap the separator SPR (see FIG. 13). Although not shown, the second mesh line included in the second sensing electrode may be equally applied. According to an embodiment of the inventive concept, the width MSL-S of the first mesh line MSL1a may be equal to or smaller than the width SPR-S of the separator SPR. As the width MSL-S of the first mesh line MSL1a is equal to or smaller than the width SPR-S of the separator SPR, the first sensing electrode TE1a may not overlap the second electrode EL2.

According to one embodiment of the inventive concept, visibility may be improved by decreasing an area of overlap between the first sensing electrode TE1a and the second electrode EL2 to which the variable voltage is applied. In addition, since the formation of parasitic capacitance between the first sensing electrode TE1a and the second electrode EL2 is minimized, generation of noise may be reduced.

Figure 14:
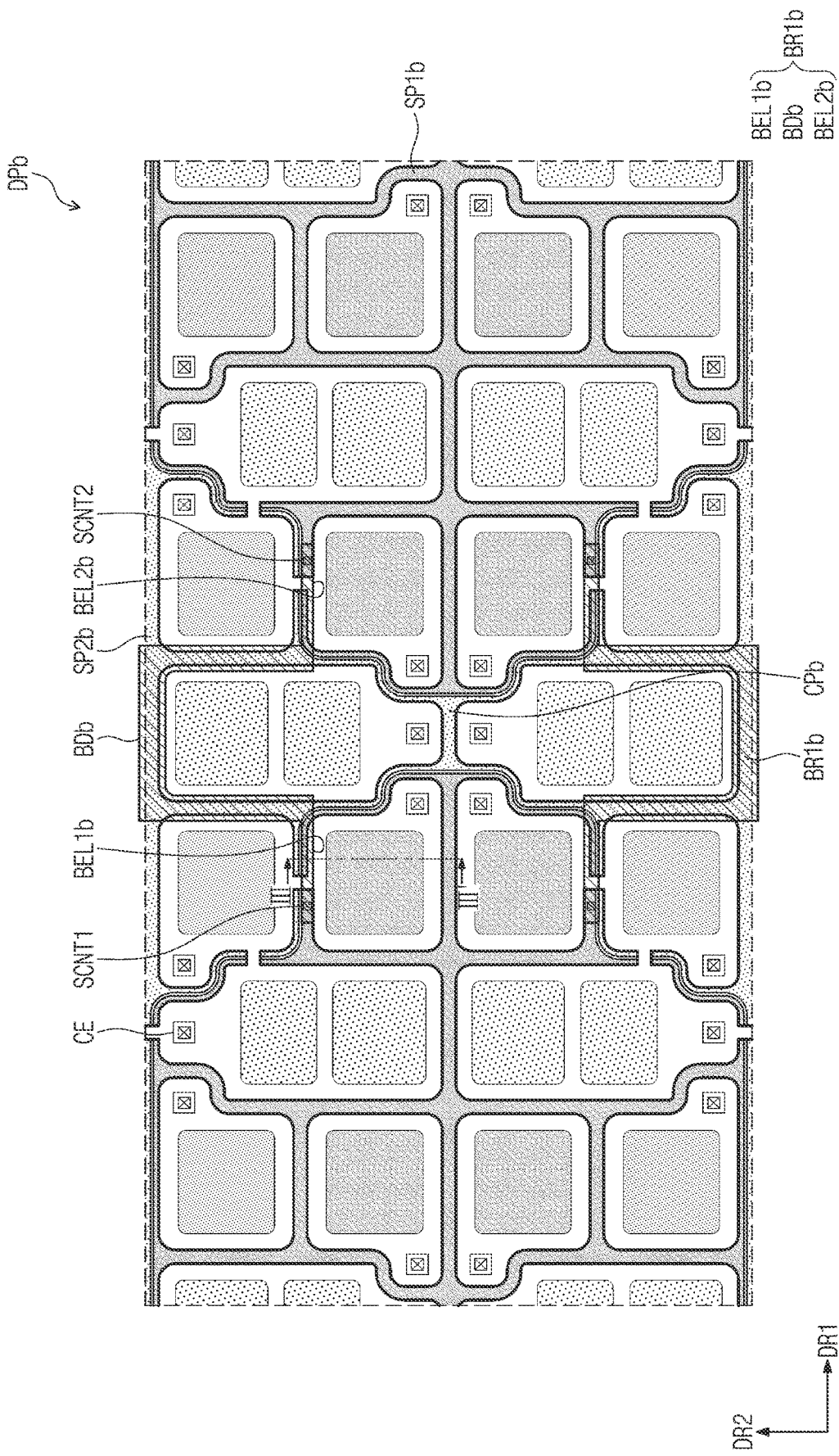
FIG. 14 is an enlarged plan view of a partial area of a display panel according to an embodiment of the inventive concept.
Figure 15:
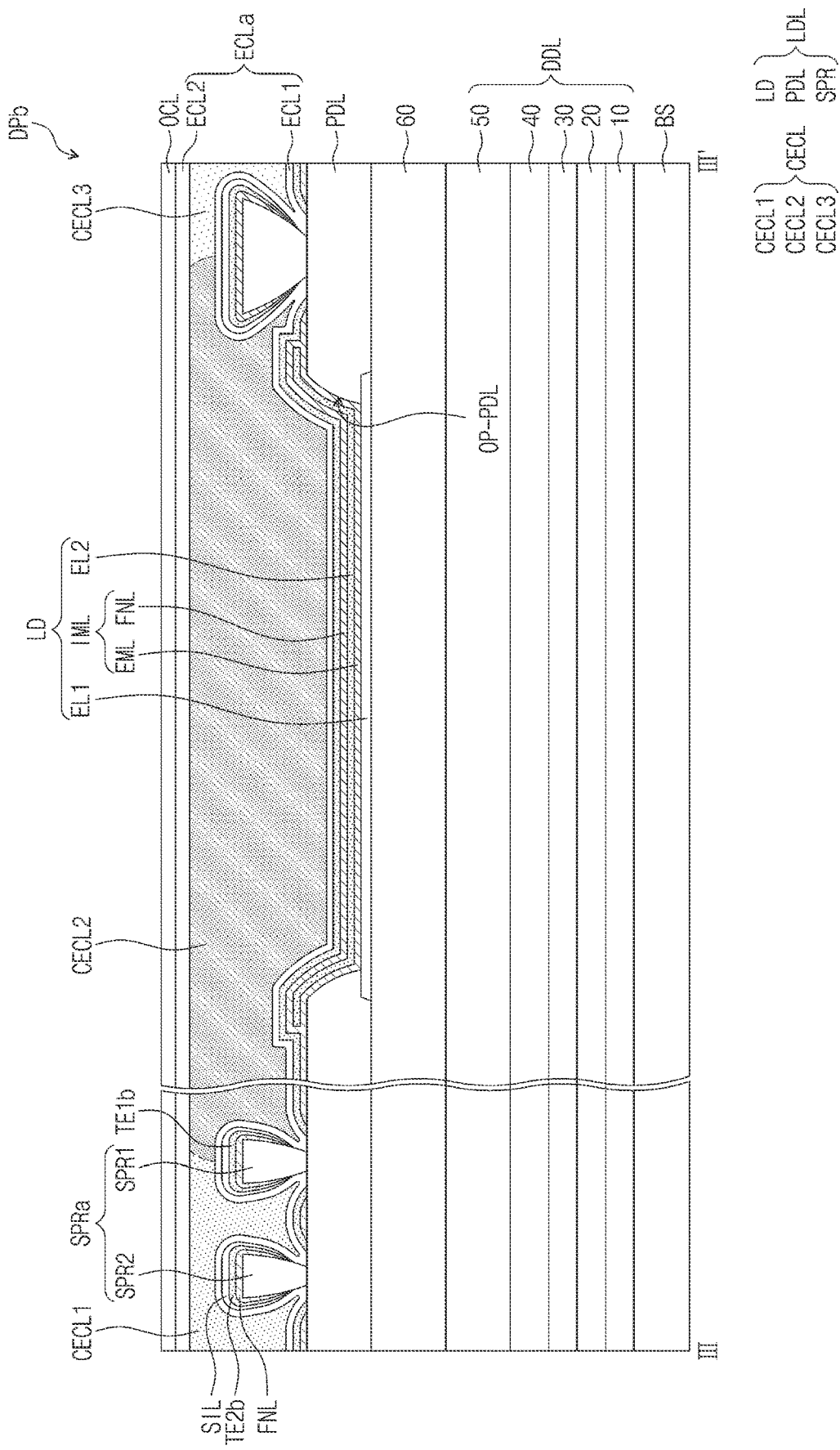
FIG. 15 is a cross-sectional view of the display panel illustrating a portion corresponding to line III-III' of FIG. 14.

FIG. 14 is an enlarged plan view of a partial area of a display panel according to an embodiment of the inventive concept. FIG. 15 is a cross-sectional view of the display panel illustrating a portion corresponding to line III-III' of FIG. 14.

Referring to FIGS. 14 and 15, the separator SPRa may include a first separator SPR1 and a second separator SPR2. The first sensing electrode TE1b may be disposed on the first separator SPR1, and the second sensing electrode TE2b may be disposed on the second separator SPR2. That is, the separator SPRa may be formed in a region adjacent to the first sensing electrode TE1b and the second sensing electrode TE2b in plan view. The first separator SPR1 and the second separator SPR2 may be spaced apart from each other. Accordingly, the first sensing electrode TE1b disposed on the first separator SPR1 and the second sensing electrode TE2b disposed on the second separator SPR2 may be spaced apart from each other. As the display panel DPb according to an embodiment includes the first separator SPR1 and the second separator SPR2 spaced apart from each other, sensing performance of the display panel DPb may be improved by increasing the adjacent areas of the first sensing electrode TE1b and the second sensing electrode TE2b.

Each of the plurality of first sensing electrodes TE1b may include a plurality of first sensing patterns SP1b arranged along the first direction DR1 and a plurality of first bridge patterns BR1b alternately arranged in the first sensing patterns SP1b. Each of the first bridge patterns BR1b electrically connects two adjacent first sensing patterns SP1b in the first direction DR1. The first sensing patterns SP1b may be disposed on the first separator SPR1. The first bridge pattern BR1b may include a first bridge end portion BEL1b and a second bridge end portion BEL2b respectively connected to two adjacent first sensing patterns SP1b, and a bridge bending portion BDb. The first bridge end portion BEL1b and the second bridge end portion BEL2b may be disposed on the first separator SPR1 and the bridge bending portion BDb may be disposed on the second separator SPR2.

Specifically, the first bridge end portion BEL1b and the second bridge end portion BEL2b overlap the first separator SPR1 and are disposed on the detection insulating layer SILa, and the bridge bending portion BDb may be disposed on the detection insulating layer SILa to overlap the second separator SPR2.

Each of the second sensing electrodes TE2b may include a plurality of second sensing patterns SP2b arranged along the second direction DR2 and a plurality of connection patterns CPb alternately arranged with the second sensing patterns SP2b. Each of the connection patterns CPb electrically connects two adjacent second sensing patterns SP2b in the second direction DR2. The second sensing patterns SP2b and the connection patterns CPb may be disposed on the second separator SPR2.

Referring to FIG. 15, the first sensing electrode TE1b and the second sensing electrode TE2b may not overlap the second electrode EL2. Specifically, the first sensing electrode TE1b and the second sensing electrode TE2b may not overlap the second electrode EL2 overlapping the plurality of light emitting units EP1, EP2, and EP3 (see FIG. 10).

According to one embodiment of the inventive concept, by decreasing the area by which the first sensing electrode TE1b and the second sensing electrode TE2b overlap the second electrode EL2 to which the variable voltage is applied, visibility may be improved. In addition, the formation of parasitic capacitance between the first sensing electrode TE1b and the second sensing electrode TE2b and the second electrode EL2 is minimized, thereby reducing noise generation.

An encapsulation layer ECLa may be disposed on the second electrode EL2 and the first sensing electrode TE1b. The encapsulation layer ECLa has the same configuration as the encapsulation layer ECLa shown in FIG. 12. The encapsulation layer ECLa may include a first encapsulation layer ECL1, a color encapsulation layer CECL disposed on the first encapsulation layer ECL1, and a second encapsulation layer ECL2 disposed on the color encapsulation layer CECL. The color encapsulation layer CECL may include a first color encapsulation layer CECL1, a second color encapsulation layer CECL2, and a third color encapsulation layer CECL3. The first color encapsulation layer CECL1 and the second color encapsulation layer CECL2 may be classified based on the first separator SPR1 or the second separator SPR2. For example, the first color encapsulation layer CECL1 and the second color encapsulation layer CECL2 may be distinguished based on the first separator SPR1.

Figure 16:
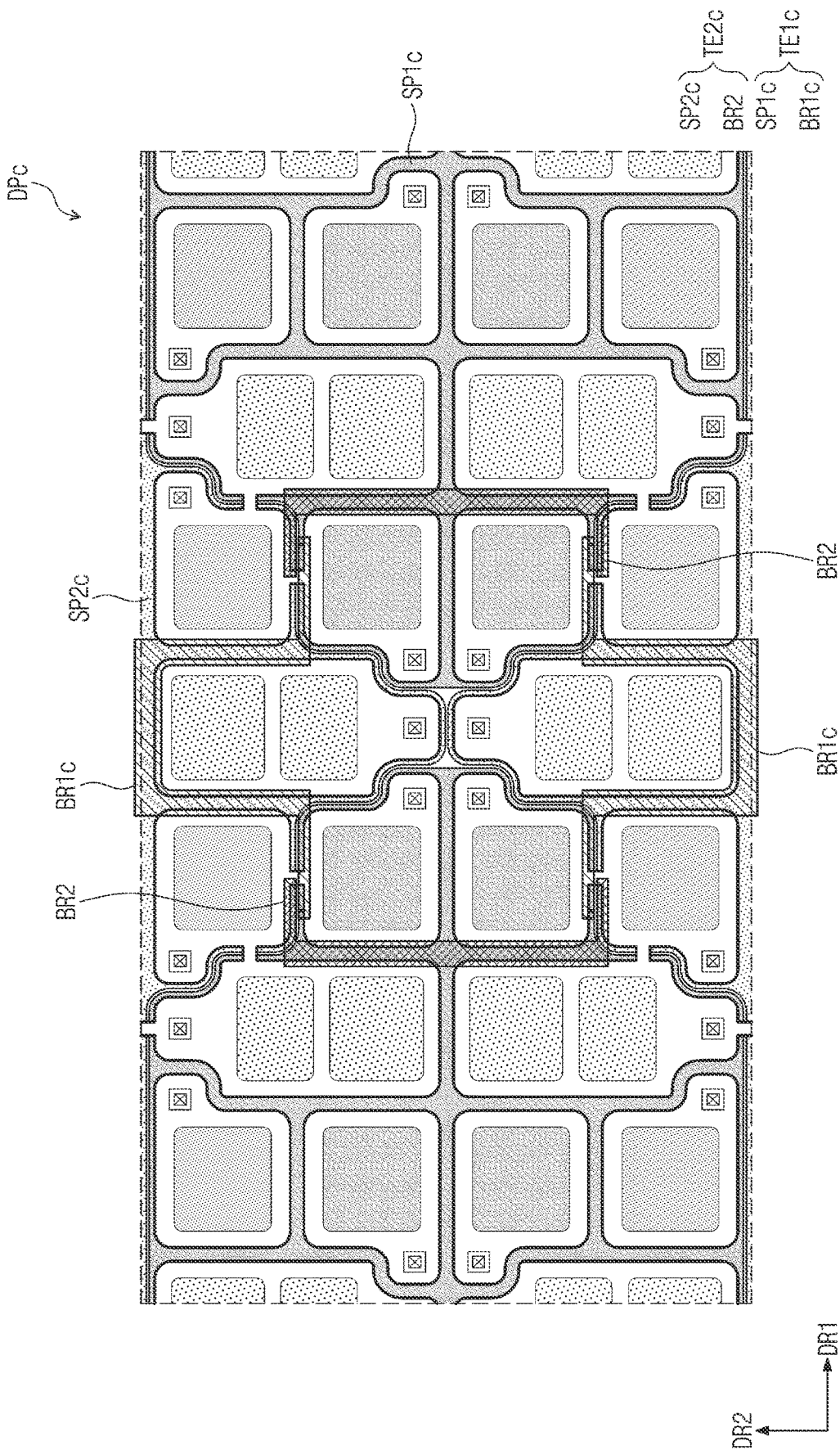
FIG. 16 is an enlarged plan view of a partial area of a display panel according to an embodiment of the inventive concept.

FIG. 16 is an enlarged plan view of a partial area of a display panel according to an embodiment of the inventive concept.

Referring to FIG. 16, the display panel DPc may include a plurality of first sensing electrodes TE1c arranged along the second direction DR2 and a plurality of second sensing electrodes TE2c arranged along the first direction DR1. Each of the second sensing electrodes TE2c may include a plurality of second sensing patterns SP2c. The second sensing electrode TE2c may further include a second bridge pattern BR2 between adjacent second sensing patterns SP2c. When the second sensing electrodes TE2c are compared with FIG. 10, the connection patterns CP (see FIG. 9) between adjacent second sensing patterns SP2c may be omitted. Specifically, the second sensing electrode TE2c may include a second bridge pattern BR2 electrically connecting two adjacent second sensing patterns SP2c among the plurality of second sensing patterns SP2 in the second direction DR2. Two second bridge patterns BR2 connecting two adjacent second sensing patterns SP2c may be spaced apart from each other in the first direction DR1. As shown, although two second bridge patterns BR2 connecting two adjacent second sensing patterns SP2c are provided, the inventive concept is not limited thereto.

The second bridge pattern BR2 may be disposed on a different layer from the second sensing patterns SP2c. The second bridge pattern BR2 may be disposed on a different layer from the first sensing patterns SP1c and the second sensing patterns SP2c, and overlap a part of the first sensing patterns SP1c. The second bridge pattern BR2 may be disposed on a layer different from the first sensing patterns SP1c, and electrically connect the two adjacent second sensing patterns SP2c. Although not shown, the second bridge pattern BR2 may be connected to each of the two adjacent second sensing patterns SP2c through a separate contact hole.

In the display panel according to an embodiment of the inventive concept, as the electrode disposed on the separator is electrically separated from the second electrode and used as a sensing electrode, a sensing function may be performed without forming a separate sensor layer on the panel. Accordingly, the process may be simplified and the thickness of the display device may be reduced.

In addition, as the sensing electrode disposed on the separator does not overlap with the second electrode, formation of parasitic capacitance between the sensing electrode and the second electrode may be minimized, thereby reducing noise generation.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A display panel comprising:
   a transistor;
   a light emitting element including a first electrode, an intermediate layer disposed on the first electrode, and a second electrode disposed on the intermediate layer and overlapping the first electrode, wherein the second electrode is electrically connected between the first electrode and the transistor;
   a pixel defining film disposed on the first electrode and defining an emission opening above the first electrode;
   at least one separator disposed on the pixel defining film; and
   one or more sensing electrodes that sense a touch interaction with the display panel, at least one of the one or more sensing electrodes being disposed on the at least one separator,
   wherein the one or more sensing electrodes and the second electrode are electrically separated by the at least one separator.

2. The display panel of claim 1, wherein the one or more sensing electrodes comprise a plurality of first sensing electrodes and a plurality of second sensing electrodes that are electrically insulated from one another.

3. The display panel of claim 2, further comprising:
   a connection wiring electrically connecting the transistor and the second electrode, wherein
   the connection wiring comprises a first connection part electrically connected to the second electrode, a second connection part electrically connected to the transistor, and an extension part extending from the first connection part and electrically connecting the first connection part and the second connection part,
   a light emitting unit is defined by the emission opening, and
   the connection wiring and the light emitting unit are provided in plurality.

4. The display panel of claim 3, wherein
   each of the first sensing electrodes comprises a plurality of first sensing patterns arranged in a first direction, and
   each of the second sensing electrodes comprises a plurality of second sensing patterns arranged in a second direction crossing the first direction.

5. The display panel of claim 4, wherein each of the first sensing electrodes further comprises a first bridge pattern electrically connecting two adjacent first sensing patterns of the first sensing patterns.

6. The display panel of claim 5, wherein the first bridge pattern is disposed on a different layer from the first sensing patterns and overlaps a part of the second sensing patterns.

7. The display panel of claim 6, further comprising:
   a detection insulating layer covering the second sensing patterns,
   wherein the first bridge pattern is disposed on the detection insulating layer.

8. The display panel of claim 5, wherein the first bridge pattern is spaced apart from the first connection part in the second direction.

9. The display panel of claim 5, wherein
   the first bridge pattern comprises a first bridge end portion and a second bridge end portion which are electrically connected to two first sensing patterns adjacent to the first bridge pattern, and a bridge bending portion electrically connecting the first bridge end portion to the second bridge end portion, and
   at least one light emitting unit is disposed between the first bridge end portion and the second bridge end portion.

10. The display panel of claim 5, wherein each of the second sensing electrodes further comprises a second bridge pattern electrically connecting two adjacent second sensing patterns among the second sensing patterns.

11. The display panel of claim 10, wherein the second bridge pattern is disposed on a different layer from the second sensing patterns and overlaps a part of the first sensing patterns.

12. The display panel of claim 11, wherein the second bridge pattern is spaced apart from the first connection part in the first direction.

13. The display panel of claim 10, wherein each of the first bridge pattern and the second bridge pattern are provided in plurality.

14. The display panel of claim 4, wherein each of the second sensing electrodes further comprises a connection pattern, which is disposed between two adjacent second sensing patterns and electrically connects the two adjacent second sensing patterns.

15. The display panel of claim 14, wherein the connection pattern is integral with the two adjacent second sensing patterns in the second direction.

16. The display panel of claim 14, wherein the connection pattern comprises first and second connection patterns spaced apart from each other in the first direction.

17. The display panel of claim 4, wherein
   the at least one separator includes a plurality of separators,
   boundary portions are defined on the separators by insulating a corresponding first sensing electrode among the first sensing electrodes and a corresponding second sensing electrode among the second sensing electrodes from each other, and some of the boundary portions are disposed between adjacent first connection parts among the first connection parts.

18. The display panel of claim 4, wherein each of the first sensing patterns comprises a first mesh line, and each of the second sensing patterns comprises a second mesh line.

19. The display panel of claim 18, wherein
a plurality of first mesh holes are defined in the first sensing patterns by each of the first mesh line, and a plurality of second mesh holes are defined in the second sensing patterns by the second mesh line, and
each of the first mesh holes and each of the second mesh holes correspond to the plurality of light emitting unit.

20. The display panel of claim 18, wherein each of the first mesh line and the second mesh line overlaps the at least one separator.

21. The display panel of claim 20, wherein a width of each of the first mesh line and the second mesh line is equal to or smaller than a width of the at least one separator.

22. The display panel of claim 2, wherein the first sensing electrodes and the second sensing electrodes are disposed on a same layer.

23. The display panel of claim 2, wherein each of the first sensing electrodes and the second sensing electrodes is non-overlapping with the second electrode in a plan view.

24. The display panel of claim 2, wherein
the at least one separator comprises a plurality of first separators and a plurality of second separators spaced apart from the first separators,
the first sensing electrodes are disposed on the first separators, and
the second sensing electrodes are disposed on the second separators.

25. The display panel of claim 1, further comprising:
a first encapsulation layer disposed on the second electrode and the one or more sensing electrodes;
a color encapsulation layer disposed on the first encapsulation layer; and
a second encapsulation layer disposed on the color encapsulation layer.

26. The display panel of claim 25, wherein
the light emitting element is one of a plurality of light emitting elements,
the plurality of light emitting elements comprises a first light emitting element, a second light emitting element, and a third light emitting element that emit different color lights, and
the color encapsulation layer comprises:
a first color encapsulation layer overlapping the first light emitting element;
a second color encapsulation layer overlapping the second light emitting element; and
a third color encapsulation layer overlapping the third light emitting element.

27. The display panel of claim 25, further comprising an overcoating layer disposed on the second encapsulation layer.

28. A display device comprising:
a display panel that displays an image; and
a light control layer disposed on the display panel,
wherein the display panel comprises:
a transistor;
a light emitting element including a first electrode, an intermediate layer disposed on the first electrode, and a second electrode disposed on the intermediate layer, wherein the second electrode is electrically connected to the transistor;
a pixel defining film disposed on the first electrode and defining an emission opening above the first electrode;
at least one separator disposed on the pixel defining film; and
one or more sensing electrodes that sense a touch interaction with the display panel, at least one of the one or more sensing electrodes being disposed on the at least one separator,
wherein the one or more sensing electrodes overlap the at least one separator and do not overlap the second electrode.

29. The display device of claim 28, wherein the one or more sensing electrodes comprise a plurality of first sensing electrodes and a plurality of second sensing electrodes that are electrically insulated from one another.

30. The display device of claim 29, wherein a width of each of the first sensing electrodes and a width of each of the second sensing electrodes is equal to or smaller than a width of the at least one separator.

31. The display device of claim 29, wherein
the display panel further comprises a connection wiring electrically connecting the transistor and the second electrode,
the connection wiring comprises a first connection part electrically connected to the second electrode, a second connection part electrically connected to the transistor, and an extension part extending from the first connection part and electrically connecting the first connection part and the second connection part,
a light emitting unit is defined by the emission opening, and
the connection wiring and the light emitting unit are provided in plurality.

32. The display device of claim 31, wherein
each of the first sensing electrodes comprises a plurality of first sensing patterns arranged in a first direction and a first bridge pattern electrically connecting two adjacent first sensing patterns of the first sensing patterns, and
each of the second sensing electrodes comprises a plurality of second sensing patterns arranged in a second direction crossing the first direction and a second bridge pattern electrically connecting two adjacent second sensing patterns of the second sensing patterns.

33. The display device of claim 32, wherein
the first bridge pattern is disposed on a different layer from the first sensing patterns and overlaps a part of the second sensing patterns, and
the second bridge pattern is disposed on a different layer from the second sensing patterns and overlaps a part of the first sensing patterns.

34. The display device of claim 32, wherein
the first bridge pattern is spaced apart from the first connection part in the second direction, and
the second bridge pattern is spaced apart from the first connection part in the first direction.

35. The display device of claim 28, wherein the light control layer comprises at least one of a dye and a pigment.

* * * * *